(12) United States Patent  
Soma et al.

(10) Patent No.: US 8,367,452 B2  
(45) Date of Patent: Feb. 5, 2013

(54) INFRARED DETECTOR, INFRARED DETECTING APPARATUS, AND METHOD OF MANUFACTURING INFRARED DETECTOR

(75) Inventors: Fumihito Soma, Tokyo (JP); Yoshikatsu Kuroda, Tokyo (JP); Kazunori Masukawa, Tokyo (JP); Masahiro Kato, Tokyo (JP); Masahito Yamaguchi, Nagoya (JP)

(73) Assignees: Mitsubishi Heavy Industries, Ltd., Tokyo (JP); National University Corporation Nagoya University, Nagoya-shi (JP)

( * ) Notice: Subject to any disclaimer, the term of this patent is extended or adjusted under 35 U.S.C. 154(b) by 240 days.

(21) Appl. No.: 12/772,380

(22) Filed: May 3, 2010

(65) Prior Publication Data

US 2011/0079765 A1 Apr. 7, 2011

(30) Foreign Application Priority Data

Oct. 2, 2009 (JP) ................................ 2009-230173

(51) Int. Cl. *H01L 21/00* (2006.01)

(52) U.S. Cl. ....... 438/57; 438/48; 257/14; 257/E31.142; 257/E31.093

(58) Field of Classification Search .................... 438/48, 438/57, 24; 257/428, E21.357, E31.093, 257/E31.033, E21.142, 14  
See application file for complete search history.

(56) References Cited

U.S. PATENT DOCUMENTS

| | | | |
|---|---|---|---|
| 2003/0047752 A1* | 3/2003 | Campbell et al. | 257/186 |
| 2005/0077539 A1* | 4/2005 | Lipson | 257/186 |
| 2006/0266998 A1* | 11/2006 | Vega et al. | 257/21 |
| 2007/0024840 A1* | 2/2007 | Fetzer et al. | 356/4.01 |
| 2009/0272903 A1 | 11/2009 | Kato et al. | |

FOREIGN PATENT DOCUMENTS

| | | |
|---|---|---|
| JP | 2000-275692 A | 10/2000 |
| JP | 2008-147521 A | 6/2008 |
| JP | 2009-253173 A | 10/2009 |

* cited by examiner

*Primary Examiner* — Caridad Everhart

(74) *Attorney, Agent, or Firm* — Westerman, Hattori, Daniels & Adrian, LLP

(57) ABSTRACT

An infrared detector including a reflection portion which transmits far- and middle-infrared rays and which reflects near-infrared and visible rays; a photo-current generating portion having a plurality of layered quantum dot structures in each of which electrons are excited by the far- and middle-infrared rays having passed through the reflection portion so as to generate photo-current; a light emitting portion having a plurality of layered quantum well structures into each of which electrons of the photo-current generated by the photo-current generating portion are injected and in each of which the electrons thus injected thereinto are recombined with holes so as to emit near-infrared and visible rays; and a photo-detecting portion which detects the near-infrared and visible rays emitted from the light emitting portion and which detects the near-infrared and visible rays emitted from the light emitting portion and then reflected by the reflection portion.

16 Claims, 12 Drawing Sheets

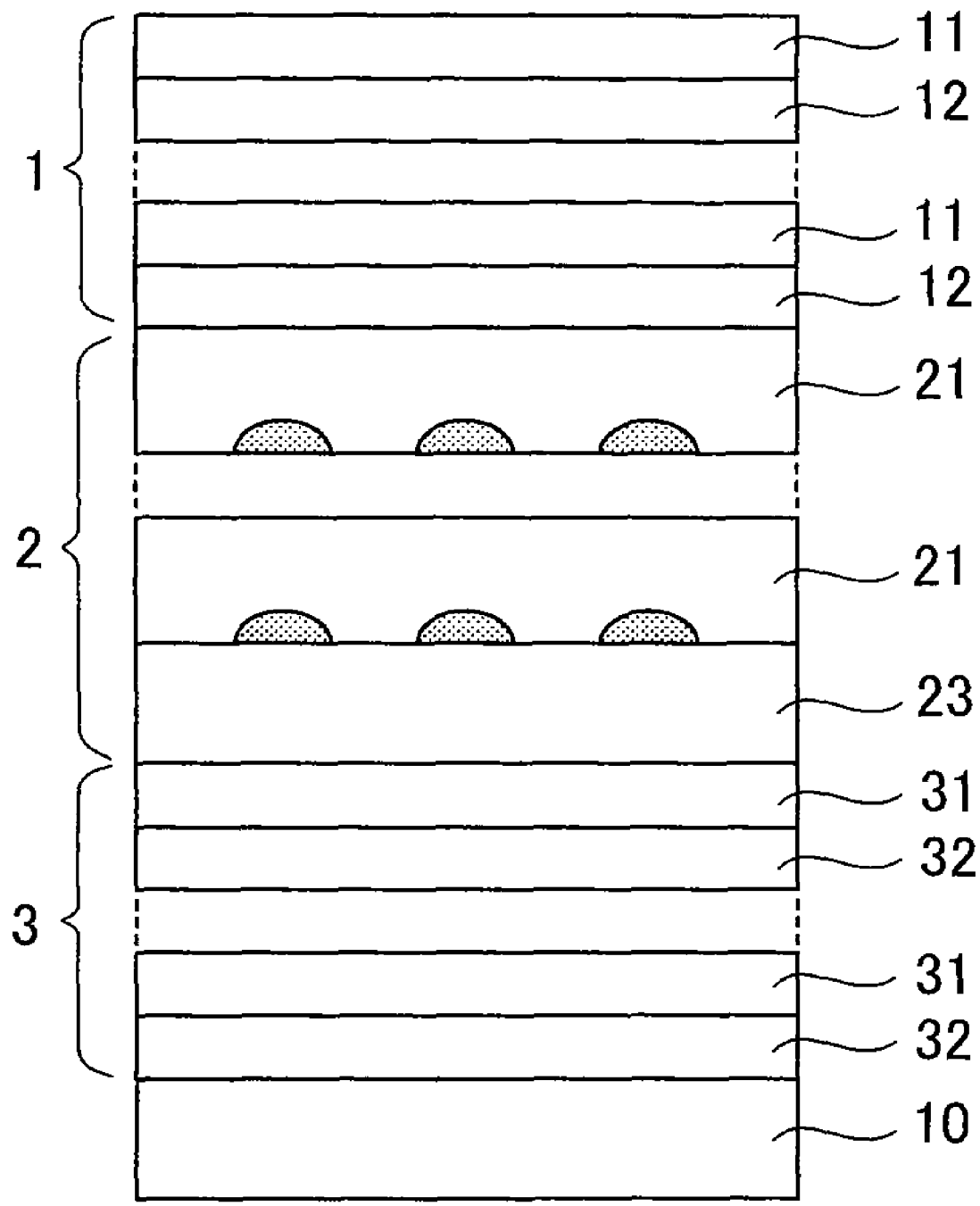

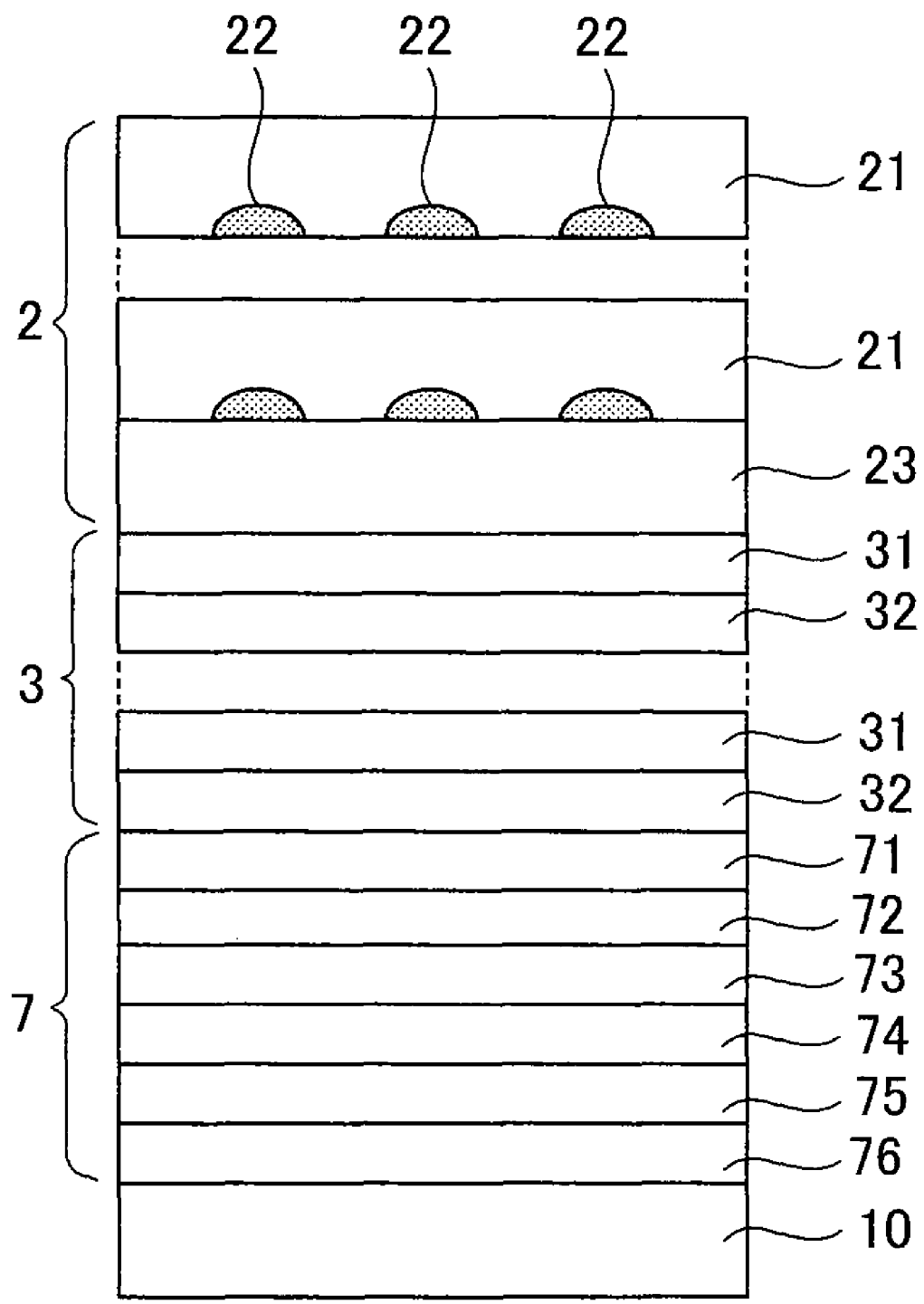

INFRARED DETECTOR, INFRARED DETECTING APPARATUS, AND METHOD OF MANUFACTURING INFRARED DETECTOR

TECHNICAL FIELD

The present invention relates to an infrared detector to detect infrared rays, an infrared detecting apparatus, and a method of manufacturing an infrared detector.

BACKGROUND ART

Among the infrared detectors that have been put to practical use, those detecting infrared rays in the middle- and far-infrared wavelength ranges (for example, a wavelength band ranging from 3 µm to 12 µm) include: infrared detectors made of a semiconductor of HgCdTe, which is a group II-VI compound; quantum well infrared photo-detectors (QWIPs) made of a superlattice of a group III-V compound semiconductor (GaAs/AlGaAs); and quantum dot infrared photo-detectors (QDIPs) made of a quantum dot.

CITATION LIST

[Patent Literature]
[Patent Literature 1] Japanese Patent Application Publication No. 2000-275692

SUMMARY OF INVENTION

[Technical Problem]
The infrared detectors made of HgCdTe can accomplish high quantum efficiency, but the low melting point and the high vapor pressure of Hg make the growth of a high-quality crystal difficult. Manufacturing of HgCdTe image sensors results in an especially poor yield. In addition, it is impossible to obtain a high-quality substrate (CdTe or the like) with a large area, and such unavailability makes it difficult to manufacture image sensors with a large number of pixels.

QWIPs detect infrared rays by photo-current caused by a transition of electrons, which is caused by the absorption of the infrared rays, between the discrete energy levels of the electrons in the quantum well. The formation of the quantum well is accomplished by a superlattice structure of AlGaAs and GaAs, so that the matured technique of GaAs crystal-growth process makes it possible to manufacture high-quality image sensors with a large area. The electrons, however, are quantized only one-dimensionally, that is, only in the stacking direction of the superlattice. Accordingly, such image sensors are not sensitive to incident infrared rays from a direction that is perpendicular to the plane, which results in extremely low sensitivity. Moreover, it is required to form an optical coupling structure for scattering incident infrared rays. For this reason, the manufacturing process is complicated.

In QDIPs, a quantum well is formed by growing self-assembled InAs dots, where electrons are three-dimensionally confined and quantized. For example, Patent Literature 1 adopts a wavelength-conversion structure in which the electrons generated in a QDIP are recombined in another quantum dot to emit light (near-infrared rays) converted to have a higher energy level than those of the incident infrared rays. Such a structure is sensitive to perpendicularly-incident rays, and the photo-excited electrons are less likely to be trapped in the quantum well again. Thus, the sensitivity of QDIPs is higher than that of QWIPs, but still lower than that of HgCdTe.

Although various infrared detectors have been proposed as described above, satisfactory final detection sensitivity has not been achieved yet. Moreover, observation of the middle- and far-infrared wavelength-ranges in space requires detection of infrared rays of weak intensity with a wide viewing angle and high resolution. What is necessary for this purpose is a large-area (large-pixel-number) image sensor made of a material with high quantum efficiency. It is difficult, however, to manufacture an image sensor that can satisfy the above-mentioned two requirements at the same time.

The present invention is made in view of the above-mentioned problems, and aims to provide an infrared detector which has high detection sensitivity and which can be made with a large area. The present invention also aims to provide an infrared detecting apparatus and a method of manufacturing an infrared detector which share the above-mentioned excellent features.

[Solution to Problem]
A first aspect of the present invention to accomplish the above-mentioned objects provides an infrared detector that includes a reflection portion, a photo-current generating portion, a light emitting portion, and a photo-detecting portion. The reflection portion transmits rays in the far-infrared range and in the middle-infrared range and reflects rays in the near-infrared range and in the visible range. The photo-current generating portion has a plurality of layered quantum dot structures. In each of the layered quantum dot structures, electrons are excited by the rays in the far-infrared range and in the middle-infrared range that have passed through the reflection portion, and the electrons thus excited generate photo-current. The light emitting portion has a plurality of layered quantum well structures. Electrons of the photo-current generated by the photo-current generating portion are injected into each of the layered quantum well structures, and the electrons thus injected into each of the layered quantum well structures are recombined with holes so as to emit rays in the near-infrared range and in the visible range. The photo-detecting portion detects the rays in the near-infrared range and in the visible range emitted from the light emitting portion, and detects the rays in the near-infrared range and in the visible range emitted from the light emitting portion and reflected by the reflection portion. In the infrared detector, at least the reflection portion, the photo-current generating portion, and the light emitting portion are made of group III-V compound semiconductors and are layered on top of a substrate. In addition, in the infrared detector, incident rays in the far-infrared range and in the middle-infrared range are detected by the detection, performed by the photo-detecting portion, of the rays in the near-infrared range and in the visible range emitted from the light emitting portion.

A second aspect of the present invention to accomplish the above-mentioned objects provides the infrared detector of the first aspect with the following additional characteristics. The reflection portion, the photo-current generating portion, and the light emitting portion together form a first element. The photo-detecting portion forms an independent second element. The first element and the second element are bonded together to form a single united body.

A third aspect of the present invention to accomplish the above-mentioned objects provides the infrared detector of the first aspect with the following additional characteristics. The reflection portion, the photo-current generating portion, the light emitting portion, the photo-detecting portion are all made of group III-V compound semiconductors, and are layered on the substrate made of a group III-V compound semiconductor so as to form a single united body.

A fourth aspect of the present invention to accomplish the above-mentioned objects provides the infrared detector of any one of the first to the third aspects with the following additional characteristics. The photo-detecting portion is made of an avalanche photo diode.

A fifth aspect of the present invention to accomplish the above-mentioned objects provides the infrared detector of any one of the first to the third aspects with the following additional characteristics. In the quantum dot structure of the photo-current generating portion, a plurality of quantum dots that are designed to be a quantum well are embedded in a barrier layer. A film thickness of a barrier layer which is included in the photo-current generating portion and which is adjacent to the light emitting portion is larger than a film thickness of the other barrier layer of the photo-current generation portion, and is smaller than an electron mean free path. A composition ratio of the barrier layer which is included in the photo-current generating portion and which is adjacent to the light emitting portion is gradually changed in the film-thickness direction so that a band gap is gradually narrowed down towards the light emitting portion.

A sixth aspect of the present invention to accomplish the above-mentioned objects provides the infrared detector of the fifth aspect with the following additional characteristics. In at least one of the quantum well structures of the light emitting portion, a well layer which is included in the light emitting portion and which is designed to be a quantum well is sandwiched by a barrier layer of the light emitting portion and the barrier layer which is included in the photo-current generating portion and which is adjacent to the light emitting portion so as to form a band gap that is to emit rays in the near-infrared range and in the visible range.

A seventh aspect of the present invention to accomplish the above-mentioned objects provides the infrared detector of any one of the first to the third aspects with the following additional characteristics. The reflection portion has a structure in which two different kinds of layers are alternately formed so as to cause distributed Bragg reflection of the rays in the near-infrared range and in the visible range while each of the layers of one kind having a refractive index that is different from a refractive index of each of the layers of the other kind.

An eighth aspect of the present invention to accomplish the above-mentioned objects provides the infrared detector according to any one of the first to the third aspects with the following additional characteristics. The quantum well dot structure of the photo-current generating portion is configured so that the electrons are excited by infrared rays in a wavelength range from 4 μm to 4.5 μm, which includes the 4.257-μm absorption wavelength of carbon dioxide.

A ninth aspect of the present invention to accomplish the above-mentioned objects provides an infrared detecting apparatus including the infrared detector of any one of the first to the third aspects.

A tenth aspect of the present invention to accomplish the above-mentioned objects provides a method of manufacturing an infrared detector with the following characteristics. The method includes a step of forming a layer of a light emitting portion on top of a substrate. The light emitting portion has a plurality of layered quantum well structures in each of which electrons and holes are recombined together so that rays in the near-infrared range and in the visible range are emitted. The method also includes a step of forming a layer of a photo-current generating portion on top of the light emitting portion. The photo-current generating portion has a plurality of layered quantum dot structures in each of which electrons are excited by rays in the far-infrared range and in the middle-infrared range, and photo-current that is to be injected into the light emitting portion is generated by the excited electrons. In addition, the method includes a step of forming a layer of a reflection portion on top of the photo-current generating portion so as to form a first element. The reflection portion transmits rays in the far-infrared range and in the middle-infrared range incident into the photo-current generating portion and reflects rays in the near-infrared range and in the visible range emitted from the light emitting portion towards a photo-detecting portion. Moreover, the method includes a step of forming an independent second element with the photo-detecting portion. The photo-detecting portion detects the rays in near-infrared range and in the visible range emitted from the light emitting portion, and detects the rays in the near-infrared range and in the visible range emitted from the light emitting portion and reflected by the reflection portion. Furthermore, the method includes a step of bonding the first element and the second element to form a single united body. In the method, at least the reflection portion, the photo-current generating portion and the light emitting portion are made of group III-V compound semiconductors by the same crystal-growth method. Manufactured thereby is an infrared detector that detects the incident rays in the far-infrared range and in the middle-infrared range by making the photo-detecting portion detect the rays in the near-infrared range and in the visible range emitted from the light emitting portion.

An eleventh aspect of the present invention to accomplish the above-mentioned objects provides a method of manufacturing an infrared detector with the following characteristics. The method includes a step of forming a layer of a photo-detecting portion on top of a substrate made of a group III-V compound semiconductor. The photo-detecting portion detects rays in the near-infrared range and in the visible range. The method also includes a step of forming a light emitting portion on top of the photo-detecting portion. The light emitting portion has a plurality of layered quantum well structures. In each of the plurality of layered quantum well structures, electrons and holes are recombined together so that rays in the near-infrared range and in the visible range to be detected by the photo-detecting portion are emitted. In addition, the method includes a step of forming a photo-current generating portion on top of the light emitting portion. The photo-current generating portion has a plurality of layered quantum dot structures in each of which electrons are excited by rays in the far-infrared range and in the middle-infrared range, and photo-current that is to be injected into the light emitting portion is generated by the excited electrons. Moreover, the method includes a step of forming a layer of a reflection portion on top of the photo-current generating portion. The reflection portion transmits rays in the far-infrared range and in the middle-infrared range incident into the photo-current generating portion and reflects rays in the near-infrared range and in the visible range that are emitted from the light emitting portion towards the photo-detecting portion. All of the reflection portion, the photo-current generating portion, the light emitting portion, and the photo-detecting portion are made of group III-V compound semiconductors by the same crystal-growth method so as to form a single united body. Manufactured thereby is an infrared detector that detects the incident rays in the far-infrared range and in the middle-infrared range by making the photo-detecting portion detect the rays in the near-infrared range and in the visible range emitted from the light emitting portion.

A twelfth aspect of the present invention to accomplish the above-mentioned objects provides the method of manufacturing an infrared detector of any one of the tenth and the eleventh aspects with the following additional characteristics. An avalanche photo diode is formed as the photo-detecting portion.

A thirteenth aspect of the present invention to accomplish the above-mentioned objects provides the method of manufacturing an infrared detector of any one of the tenth to the eleventh aspects with the following characteristics. As the quantum dot structure of the photo-current generating portion, a structure is formed by embedding a plurality of quantum dots that are designed to be a quantum well in a barrier layer. A barrier layer which is included in the photo-current generating portion and which is adjacent to the light emitting portion is formed in a film thickness which is larger than the film thickness of the other barrier layer of the photo-current generation portion and which is smaller than an electron mean free path. The barrier layer which is included in the photo-current generating portion and which is adjacent to the light emitting portion is formed to have a composition ratio that is gradually changed in the film-thickness direction so that a band gap is gradually narrowed down towards the light emitting portion.

A fourteenth aspect of the present invention to accomplish the above-mentioned objects provides the method of manufacturing an infrared detector according to the thirteenth aspect with the following additional characteristics. As at least one of the quantum well structures of the light emitting portion, a structure is formed by sandwiching a well layer which is included in the light emitting portion and which is designed to be a quantum well between a barrier layer of the light emitting portion and the barrier layer which is included in the photo-current generating portion and which is adjacent to the light emitting portion so as to form a band gap that is to emit rays in the near-infrared range and in the visible range.

A fifteenth aspect of the present invention to accomplish the above-mentioned objects provides the method of manufacturing an infrared detector of any one of the tenth to the eleventh aspects with the following characteristics. As the reflection portion, a structure is formed by alternately forming two different kinds of layers so as to cause distributed Bragg reflection of the rays in the near-infrared range and in the visible range. Each of the layers of one kind has a refractive index that is different from a refractive index of each of the layers of the other kind.

A sixteenth aspect of the present invention to accomplish the above-mentioned objects provides the method of manufacturing an infrared detector of any one of the tenth to the eleventh aspects with the following additional characteristics. The quantum dot structures of the photo-current generating portion are formed so that the electrons are excited by infrared rays in a wavelength range from 4 µm to 4.5 µm, which includes the 4.257-µm absorption wavelength of carbon dioxide.

[Advantageous Effects of Invention]

According to the first to the third aspects and according to the tenth and the eleventh aspects of the present invention, photo-current is generated by the rays in the far-infrared range and in the middle-infrared range incident into the photo-current generating portion with what is known as a QDIP structure. The electrons of the photo-current thus generated are injected into the light emitting portion. The electrons thus injected and the holes are recombined so as to emit rays in the near-infrared range and in the visible range. The emitted rays in the near-infrared range and in the visible range are reflected by the reflection portion so as to be confined to the inside of the infrared detector. Then, the photo-detecting portion detects the emitted rays in the near-infrared range and in the visible range. Consequently, the infrared detector can achieve improvement in the detection sensitivity. In addition, the infrared detector is formed by forming the layers made of group III-V compound semiconductors on top of the substrate made of a group III-V compound semiconductor (for example, a GaAs substrate). Accordingly, an image sensor of a large area (a large number of pixels) can be obtained. Moreover, the QDIP structure has sensitivity to perpendicularly-incident rays in the far-infrared range and in the middle-infrared range. Accordingly, unlike the QWIP structure, it is not necessary to form an optical coupling structure for scattering incident rays. Thus, the element structure is simplified, and the manufacturing process is also simplified.

According to the third and the eleventh aspects of the present invention, all of the reflection portion, the photo-current generating portion, the light emitting portion, and the photo-detecting portion are layered on top of the substrate so as to form a single united body. Consequently, the photo-detecting portion can detect, without loss, the rays in the near-infrared range and in the visible range emitted by the light emitting portion, so that the detection sensitivity can further be improved.

According to the fourth and the twelfth aspects of the present invention, an avalanche photo diode is used as the photo-detecting portion. Consequently, the photo-detecting portion can detect, with high sensitivity, the rays in the near-infrared range and in the visible range emitted by the light emitting portion, so that the detection sensitivity can further be improved.

According to the fifth and the thirteenth aspects of the present invention, the barrier layer which is included in the photo-current generating portion and which is adjacent to the light emitting portion is formed in a film thickness that is smaller than the electron mean free path. In addition, the composition ratio of the above-mentioned barrier layer is gradually changed in the film-thickness direction so that the band gap can be gradually narrowed down towards the light emitting portion. Consequently, the electrons can be injected into the light emitting portion efficiently without causing the scattering of the electrons, so that the light emitting portion can emit, with high efficiency, the rays in the near-infrared range and in the visible range. As a result, the detection sensitivity can further be improved.

According to the sixth and the fourteenth aspects of the present invention, one of the quantum well structures of the light emitting portion can be formed using the adjacent barrier layer of the photo-current generating portion. Consequently, a band gap to emit the rays in the near-infrared range and in the visible range can be formed with a simple structure.

According to the seventh and the fifteenth aspects of the present invention, the reflection portion has a structure to cause distributed Bragg reflection. Consequently, the rays in the near-infrared range and in the visible range emitted from the light emitting portion towards the reflection portion can be reflected, with high efficiency, so as to make the reflected rays enter the side of the photo-detecting portion. As a result, the detection sensitivity can further be improved.

According to the eighth and the sixteenth aspects of the present invention, each of the quantum dot structures of the photo-current generating portion is formed so that the electrons are excited by the infrared rays in a wavelength range from 4 µm to 4.5 µm, which includes the 4.257-µm absorption wavelength of carbon dioxide. Consequently, carbon dioxide, which is the detection target, can be detected with high efficiency by precluding the influence of the other molecules.

According to the ninth aspect of the present invention, the use of the infrared detector of any one of the first to the eighth aspects allows the infrared detecting apparatus to have high detection sensitivity and a large area (a large number of pixels).

BRIEF DESCRIPTION OF DRAWINGS

FIG. 2C is a diagram describing the method of manufacturing the infrared detector illustrated in FIG. 1B.

FIG. 5C is a diagram describing the method of manufacturing the infrared detector illustrated in FIG. 4B.

DESCRIPTION OF EMBODIMENTS

Detailed description will be given below of an infrared detector, an infrared detecting apparatus, and a method of manufacturing an infrared detector according to the present invention with reference to FIGS. 1A and 1B to 7. Note that the description of the present invention is based on a configuration in which GaAs, which is a group III-V compound semiconductor, is the basic composition of the substrate and that of the detector. The semiconductor composition of the substrate and that of the detector, however, can be selected appropriately in accordance with the wavelength to be detected (hereafter, also referred to as the detection-target wavelength).

For example, when the detection-target wavelength ranges from 2 μm to 12 μm, the detector may be formed with a GaAs-based material (for example, GaAs, AlGaAs, InGaAs, InAs) on a GaAs substrate. This is the case of embodiments to be described below. When the detection-target wavelength is shifted to the long-wavelength side, the detector may be formed with a GaAs-based material (for example, GaAs, InGaAs, InAlAs, InGaAlAs) on an InP substrate. When the detection-target wavelength ranges from 2 μm to 10 μm, which is a little wider on the short-wavelength side than the above-mentioned case of the embodiments, the detector may be formed with a GaN-based material on a sapphire substrate, a Si substrate, a SiC substrate, or a GaN (gallium nitride) substrate.

[Embodiment 1]

Figure 1A:
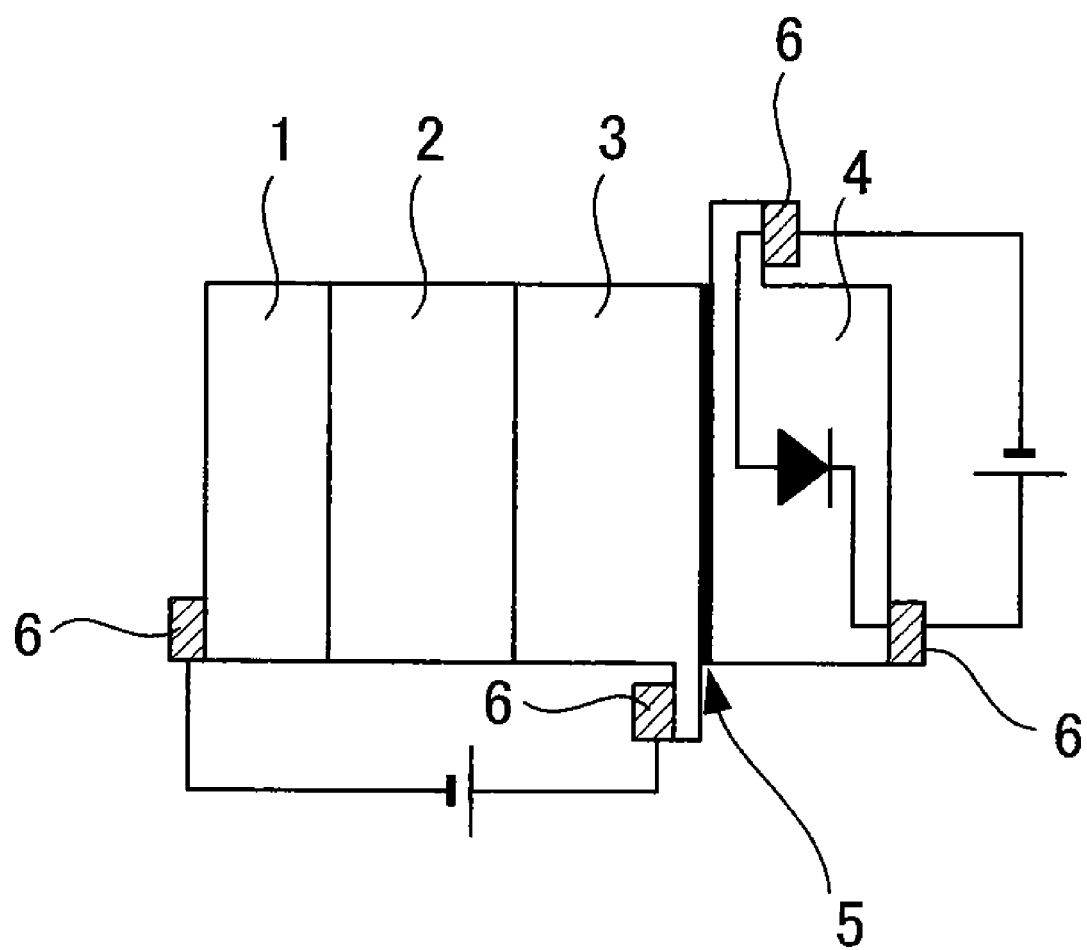
FIG. 1A is a diagram describing, schematically, the configuration of an infrared detector according to a first embodiment of the present invention.
Figure 1B:
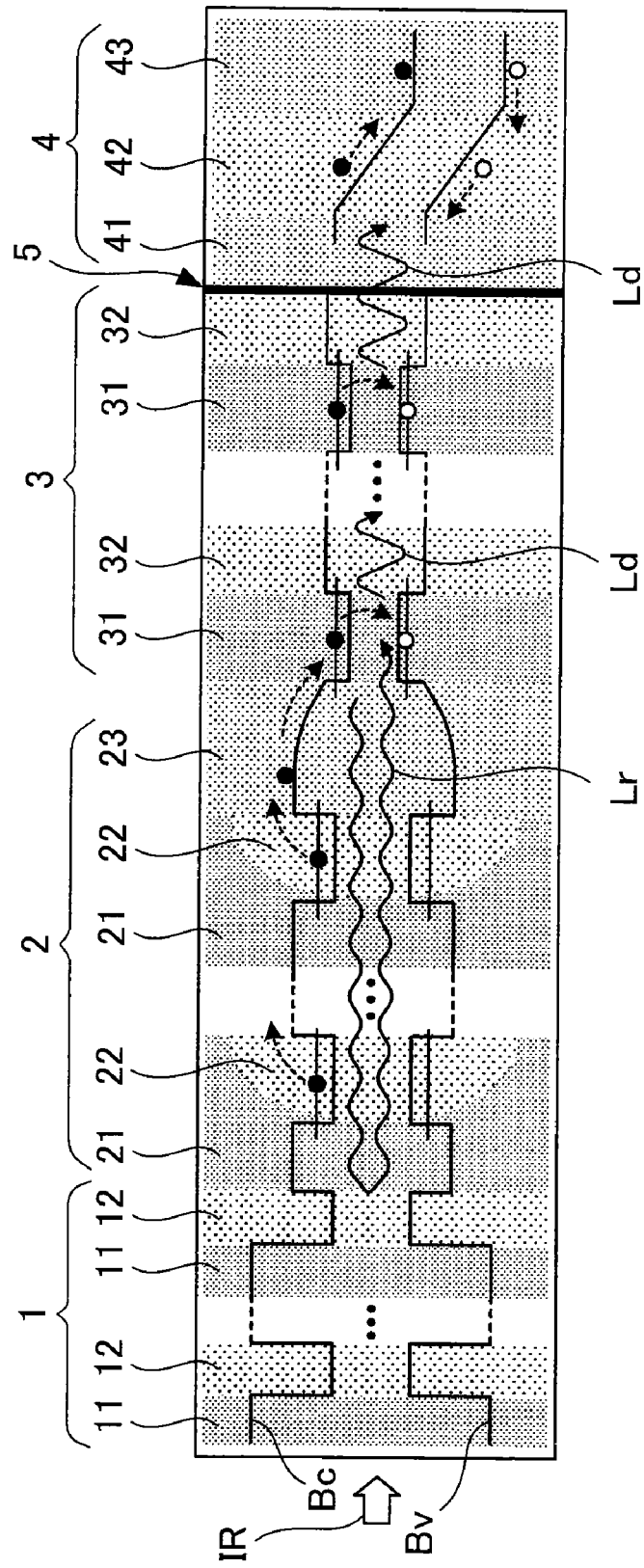
FIG. 1B is a diagram describing the infrared detector according to the first embodiment of the present invention, describing the structure of the infrared detector and its energy bands.
Figure 2A:
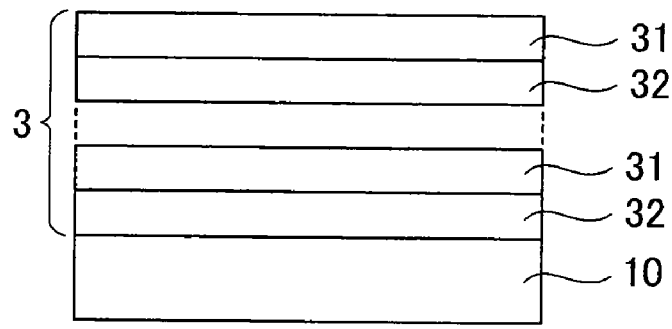
FIG. 2A is a diagram describing a method of manufacturing the infrared detector illustrated in FIG. 1B.
Figure 2B:
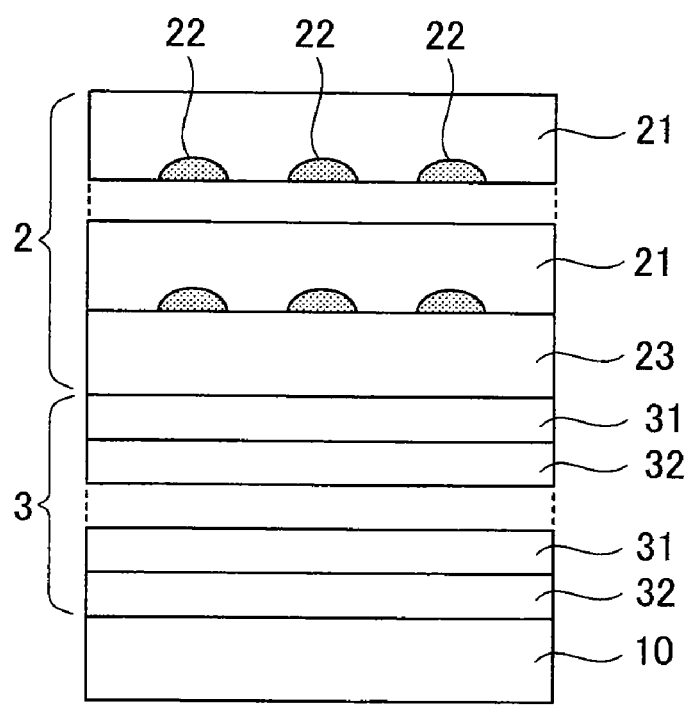
FIG. 2B is a diagram describing the method of manufacturing the infrared detector illustrated in FIG. 1B.

FIGS. 1A and 1B are diagrams describing an infrared detector according to a first embodiment of the present invention. FIG. 1A is a diagram describing, schematically, the configuration of the infrared detector. FIG. 1B is a diagram describing the structure of the infrared detector and the energy bands thereof. FIGS. 2A to 2C are diagrams describing a method of manufacturing the infrared detector.

As FIG. 1A illustrates, the infrared detector of Embodiment 1 includes a first element and a second element that are bonded together with a bonding portion 5 so as to form an integrated body. The first element includes a reflection portion 1, a photo-current generating portion 2, and a light emitting portion 3. The reflection portion 1 transmits rays in the far-infrared range and in the middle-infrared range, but reflects rays in the near-infrared range and in the visible range. The photo-current generating portion 2 has multiple quantum dot structures. In the multiple quantum well structure, the rays in the far-infrared range and in the middle-infrared range that have passed through the reflection portion 1 excite electrons, and the electrons thus excited generate photo current. The light emitting portion 3 has multiple quantum well structures. The electrons of the photo current thus generated in the photo-current generating portion 2 are injected into the multiple quantum well structures, and are recombined with the holes. Consequently, rays in the near-infrared range and in the visible range are emitted from the light emitting portion 3. The second element includes a photo-detecting portion 4. The photo-detecting portion 4 detects the rays in the near-infrared range and in the visible range thus emitted from the light emitting portion 3. Some of the rays in the near-infrared range and in the visible range that are emitted from the light emitting portion 3 are reflected by the reflection portion 1. These rays reflected by the reflection portion 1 are also detected by the photo-detecting portion 4.

Electrodes 6 are provided individually to the first element and to the second element, as well. The first element and the second element are driven independently of each other by the application of their respective predetermined voltages. Note that, although illustrated in none of FIGS. 1A to 1B and 2A to 2C, contact layers are provided to electrically connect each of the electrodes 6 to the corresponding one of the first and the second elements.

In the infrared detector of Embodiment 1, at least the reflecting portion 1, the photo-current generating portion 2, and the light emitting portion (i.e., the first element) are each made of a group III-V compound semiconductor (for example, a GaAs-based material). In the infrared detector, layers of the light emitting portion 3, the photo-current generating portion 2, and the reflecting portion 1 (i.e., the first element) are formed, in this order, on top of a substrate made of a group III-V compound semiconductor (for example, a GaAs substrate).

More specific element structure will be described with reference to FIG. 1B.

In the first element, the reflecting portion 1 includes first reflection layers 11 and second reflection layers 12. The refractive index of each first reflection layer 11 is different from that of each second reflection layer 12. The first element has a structure in which the plural first reflection layers 11 and the plural second reflection layers 12 are formed alternately and cyclically so that distributed Bragg reflection of the rays in the near-infrared range and in the visible range can be caused. As to the materials used for these layers, the first reflection layers 11 are made, for example, of AlAs while the second reflection layers 12 are made, for example, of GaAs.

The photo-current generating portion 2 includes barrier layers 21 and multiple quantum dots 22. The quantum dots 22 are designed to function as a quantum well. The multiple layers each formed with the quantum dots 22 which are embedded in the barrier layer 21 form the multiple structures of the photo-current generating portion 2. The photo-current generating portion 2 has a structure equivalent to what is known as a QDIP, and has a structure with the barrier layers 21 made, for example, of AlGaAs and the quantum dots 22 made, for example, of $In_xGa_{1-x}As$ ($0<x\leqq1$). There are things that have to be noted concerning one of the barrier layers 21 adjacent to the light emitting portion 3 (hereafter, that barrier layer 21 will be referred to as a barrier layer 23). While the composition of the barrier layer 23 is basically the same as the composition of the other barrier layers 21, the proportion of each constituent of the barrier layer 23 is gradually changing in the film-thickness direction of the barrier layer 23 for the reasons to be described later. Consequently, the band gap is gradually narrowed towards the light emitting portion 3. In addition, the film thickness of the barrier layer 23 is larger than that of each barrier layer 21, but thinner than the electron mean free path. Note that, to simplify the description, FIG. 1B illustrates one quantum dot 22 in each layer of the multiple structures. However, as FIG. 2B and so forth illustrate, the multiple quantum dots 22 are actually formed in each layer, and a multiple number of such layers are formed with the barrier layers 21 each interposed between two of the layers.

The light emitting portion 3 includes a well layer 31 and a barrier layer 32. In the single quantum well structure of the light emitting portion 3, the well layer 31, which is designed to function as a quantum well, is sandwiched by the barrier layer 32 of the light emitting portion 3 and the adjacent barrier layer 23 of the photo-current generating portion 2 so as to form a band gap that is to emit rays in the near-infrared range and in the visible range. Moreover, multiple numbers of the well layers 31 and the barrier layers 32 are alternately stacked to form the multiple quantum well structures of the light emitting portion 3. As to the materials used for these layers, the well layer 31 is made, for example, of InGaAs while the barrier layer 32 is made, for example, of GaAs. Alternatively, the barrier layer 32 may be made of AlGaAs. In addition, the barrier layer 32 may serve also as a contact layer that the electrode 6 is connected to.

In the second element, the photo-detecting portion 4 includes a p-type region layer 41, an intrinsic layer 42, and an n-type region layer 43. The intrinsic layer 42 is sandwiched by the p-type region layer 41 and the n-type region layer 43. Accordingly, the second element is a pin photodiode (hereafter, abbreviated as pinPD). The basic composition of the p-type region layer 41, of the intrinsic layer 42, and of the n-type region layer 43 is, for example, silicon (Si).

Note that the pinPD configuration described above is only an example of the second element. The pinPD may be replaced with a pn photodiode or an avalanche photodiode (hereafter, abbreviated as APD). In addition, the Si-based photodiode may be replaced with a GaAs-based photodiode.

The infrared detector of Embodiment 1 is configured to have the following detection target wavelength. The rays in the far-infrared range and in the middle-infrared range that excite the electrons in the photo-current generating portion 2 have a wavelength ranging from 2 μm to 12 μm. The rays in the near-infrared range and in the visible range that are emitted from the light emitting portion 3 and detected by the photo-detecting portion 4 have a wavelength ranging from 860 nm to 1000 nm (at normal temperature).

Next, the operational principle of the infrared detector of Embodiment 1 will be described with reference to the energy bands that FIG. 1B illustrates. In FIG. 1B, Bc represents the conduction band, and Bv represents the valence band. Rays in the far-infrared range and in the middle-infrared range, which are denoted by IR, enter the infrared detector from the left-hand side of the drawing.

As FIG. 1B illustrates, quantum wells are formed in the photo-current generating portion 2 by providing the quantum dots 22 therein, and the electrons (represented by black circles in the drawing) exist in the quantum wells and at the energy level of the conduction-band side (Bc side). These electrons are excited by absorbing the incident rays in the far-infrared range and in the middle-infrared range. The electrons are eventually injected into the well layer 31 of the light emitting portion 3 via the barrier layer 23 (see, the arrowed dot-lines). Here, the electrons having been generated in the photo-current generating portion 2 can be efficiently injected into the well layer 31 of the light emitting portion 3 without scatter by setting appropriately the composition and the film thickness of the barrier layer 23 (detailed description for the settings will be given later).

As FIG. 1B illustrates, multiple quantum wells are formed in the light emitting portion 3, as well, by sandwiching the well layers 31 between the barrier layer 23 and the barrier layer 32 and between pairs of the adjacent barrier layers 32. In the well layer 31, holes (represented by the white circle in the drawing) exist at the energy level of the valence-band side (Bv side). The holes and the electrons injected into the well layer 31 are recombined in the well layer 31, so that rays in the near-infrared range and in the visible range, which have larger energy, can be emitted. The multiple quantum well structures allow the electrons injected from the photo-current generating portion 2 to be recombined with the holes in the well layers 31 efficiently, so that the above-described rays in the near-infrared range and in the visible range can be efficiently emitted.

The rays in the near-infrared range and in the visible range are emitted mainly in the stacking direction of the layers of the infrared detector of Embodiment 1 (the horizontal direction in the drawing). The rays in the near-infrared range and in the visible range emitted to the side of the photo-detecting portion 4 (such rays are represented by Ld in the drawing) enter directly the photo-detecting portion 4, and the intensity of the rays Ld is measured by the photo-detecting portion 4. On the other hand, the rays in the near-infrared range and in the visible range emitted to the side of the reflection portion 1 (such rays are represented by Lr in the drawing) are reflected with high efficiency by the distributed Bragg reflection that occurs in the reflection portion 1, and then enter the photo-detecting portion 4. The intensity of the rays thus entering the photo-detecting portion 4 is measured by the photo-detecting portion 4. As a consequence, the rays in the near-infrared range and in the visible range emitted from the light emitting portion 3 can be detected by the photo-detecting portion 4 with high efficiency.

Once the rays in the near-infrared range and in the visible range enter the photo-detecting portion 4, the rays then pass through the p-type region layer 41. After that, most of the rays that have passed through the p-type region layer 41 are absorbed in the intrinsic layer 42, so that electron-hole pairs are formed. These carriers (i.e., the electrons and the holes) drift and flow into the p-type region layer 41 and into the n-type region layer 43, so that the photo-current is generated. In summary, the rays in the far-infrared range and in the middle-infrared range incident into the infrared detector can be efficiently detected by detecting, with the photo-detecting portion 4, the rays in the near-infrared range and in the visible range emitted from the light emitting portion 3. Note that, normally, the photo-detecting portion 4 is reversely biased for the purpose of fast response.

Note that the relationship among the photo-current generating portion 2, the light emitting portion 3, the photo-detecting portion 4 is also important for the efficient absorption of the incident rays in the far-infrared range and in the middle-infrared, the efficient emission of the rays in the near-infrared range and in the visible range, and the efficient detection of the emitted rays in the near-infrared range and in the visible range, respectively in the photo-current generating portion 2 with the QDIP structure, the light emitting portion 3 with the quantum well structures, and the photo-detecting portion 4 with the PD structure. Specifically, these portions are formed to satisfy [infrared-rays absorption energy in the photo-current generating portion 2<absorption energy in the photo-detecting portion 4<energy in the well layers 31 of the light emitting portion 3<fundamental absorption energy from valence band to the conduction band in the photo-current generating portion 2].

As has been described above, the infrared detector of Embodiment 1 has a wavelength-conversion function to convert the rays in the far-infrared range and in the middle-infrared range that have entered the infrared detector into the rays in the near-infrared range and in the visible range that have larger energy than the rays in the far-infrared range and in the middle-infrared range. The wavelength conversion is accomplished by making the light emitting portion 3 emit the rays in the near-infrared range and in the visible range. To this end, the electrons generated in the photo-current generating portion 2 by the incident rays in the far-infrared range and in the middle-infrared range are recombined with the holes in the light emitting portion 3. Besides the wavelength-conversion function, the infrared detector of Embodiment 1 has an optical confinement function to confine the rays that have been converted into the rays in the near-infrared range and in the visible range to the inside of the infrared detector. To this end, the reflection portion 1 reflects the rays in the near-infrared range and in the visible range that have been emitted from the light emitting portion 3. In summary, the infrared detector of Embodiment 1 is formed as a united body by combining together the photo-current generating portion 2 that has a QDIP structure, the light emitting portion 3 that has the wavelength-conversion function, and the reflection portion 1 that has the optical confinement function. The rays in the near-infrared range and in the visible range that have been subjected to the wavelength conversion are confined to the inside of the single infrared detector, and detected by the same single infrared detector. For this reason, in comparison to the ordinary QDIP-type infrared detectors, the infrared detector of Embodiment 1 can accomplish an improvement in the detection efficiency (i.e., an improved S/N ratio).

Note that the photo-current generating portion 2 and the light emitting portion 3 described above in Embodiment 1 are n-type devices that employ electrons as the carriers. Alternatively, the photo-current generating portion 2 and the light emitting portion 3 may be p-type devices that employ holes as the carriers. Although the operational principle of this case is the same as in the above-described case of Embodiment 1 with electrons as the carriers, there are differences between these cases in the barrier heights of the conductive band and of the valence band as well as in the effective mass. Accordingly, the photo-current generating portion 2 and the light emitting portion 3 of the case with holes as the carriers have to be configured appropriately by taking these differences into account.

Next, a method of manufacturing an infrared detector according to Embodiment 1 will be described with reference to FIGS. 2A to 2C. Note that the pinPD of the second element is formed independently of the first element by a manufacturing method that has been publicly known. For this reason, the description of the method of manufacturing the pinPD will not be given below.

1. Preparation Step

To begin with, a GaAs substrate 10 is subjected to an ultrasonic cleaning process using an organic alkali solvent, such as Semicoclean (trade name), and is then subjected to another ultrasonic cleaning process using ultrapure water. After the cleaning processes, the GaAs substrate 10 is brought into a pre-bake chamber, and is pre-baked (approximately at 200° C.) under an ultrahigh vacuum condition (approximately, at a pressure ranging from $1 \times 10^{-7}$ torr to $1 \times 10^{-10}$ torr) so as to remove the moisture.

In the meanwhile, Ga, Al, As, and In are heated to a high temperature in a molecular beam epitaxy (MBE) chamber, and the molecular beam pressure of each substance is measured. Then, the growth rates of GaAs, AlAs, AlGaAs, InGaAs, and InAs are measured by opening the molecular beam cell shutters when necessary. For example, when the growth rate of GaAs is measured, the As cell shutter and the Ga cell shutter are opened so as to allow GaAs to grow. The occurrence of the GaAs growth has to be checked. Note that, the method used to form layers described later is not limited to the MBE method, and the metal organic chemical vapor deposition (MOCVD) method, for example, may be used.

While the As pressure is set at around $1 \times 10^{-5}$ torr, the GaAs substrate 10 from which the moisture has been removed is brought into the MBE chamber. The GaAs substrate 10 is then heated up to 580° C. In this event, while the temperature is 300° C. or higher, the As cell shutter is opened to avoid the separation of As.

2. Growth Step

The plural barrier layers 32 made of GaAs and the plural well layers 31 made of InGaAs are alternately formed on top of the GaAs substrate 10 by the MBE method. Thus formed is the light emitting portion 3 (see FIG. 2A). During these series of processes, the growth time is determined on the basis of each growth rate calculated beforehand so that each layer can have a designed film thickness. In accordance with the growth time thus determined, a control to open and close the cell shutters is carried out. Once the growth of each of the barrier layers 32 made of GaAs has been finished, a growth-interruption time (migration time) of approximately 30 seconds is secured so as to obtain a flat interface. The well layer 31 has to be lower than the band gap of the barrier layer 32, so that the In composition is increased as much as possible. However, there are some things that have to be noted as to the increasing of the In composition. As the In composition increases, the layer (flat plane) becomes thinner and thinner. For example, with the In composition of 0.2, the well layer 31 has a thickness of 4.2 nm or smaller. With the well layer 31 of 4.2-nm or larger thickness, a quantum dot is produced. With the In composition of 0.3, the well layer 31 has a thickness of 1.7 nm or smaller. When the well layer 31 is too thin, the light-emitting efficiency is impaired. For this reason, the well layer 31 preferably has a 1-nm thickness, at least. Accordingly, in accordance with the In composition, the film thickness of the well layer 31 is set at an appropriate range.

Subsequently, the barrier layer 23 made of AlGaAs is formed on top of the light emitting portion 3 by the MBE method as in the case of the formation of the barrier layers 32 and the well layers 31. Then, the multiple quantum dots 22 made of $In_xGa_{1-x}As$ ($0<x\leq1$) are formed. Thereafter, the barrier layer 21 made of AlGaAs is formed so that the multiple quantum dots 22 previously formed are embedded in the barrier layer 21. A multiple number of such layers each formed with the quantum dots 22 embedded in the barrier layer 21 are formed. Thus formed is the photo-current generating portion 2 (see FIG. 2B). During these series of processes, the growth time is determined on the basis of each growth rate calculated beforehand so that each layer can have a designed film thickness and a designed size. In accordance with the growth time thus determined, a control to open and close the cell shutters is carried out. Every time the growth of each of the barrier layers 21 and 23 made of AlGaAs has been finished, a growth-interruption time of approximately 30 seconds is secured so as to obtain a flat interface. In addition, the number of layers of the barrier layers 21 with the quantum dots 22 is determined normally so that the formation of one barrier layer 21 with the quantum dots 22 may be repeated 10 to 100 times.

The quantum dots 22 made of $In_xGa_{1-x}As$ ($0<x\leq1$) are formed, using the MBE method, for example, at a growth temperature of approximately 500° C., by the self-assembled phenomenon in the S-K (Stranski-Krastanov) mode utilizing lattice mismatch. In this self-assembled phenomenon, first, at the initial stage of the growth, a flat $In_xGa_{1-x}As$ ($0<x\leq1$) wetting layer is grown two-dimensionally following the crystal structure of AlGaAs of the barrier layer 21 or 23 that serves as the three-dimensionally into the form of islands material. Then, to relieve the strain energy due to the difference in lattice constant from the underlayer material, the $In_xGa_{1-x}As$ ($0<x\leq1$) wetting layer with such a flat structure is rearranged, so that the $In_xGa_{1-x}As$ ($0<x\leq1$) layer is grown three-dimensionally into the form of islands. Thus, the multiple quantum dots 22 are formed.

Each of the barrier layers 21 has a 25-nm thickness, at least. Such a thickness is large enough to prevent the electrons confined in the quantum dots 22 from reacting with the electrons in the quantum dots 22 which are located adjacent in the stacking direction. Normally, the thickness of each barrier layer 21 is set at 25 nm to 50 nm. On the other hand, the material and composition (for example, InAs, InGaAs, InAlAs, InGaAlAs, GaInNAs, GaSb, AlGaSb, InGaSb, GaAsSb), the size (for example, 3 nm to 40 nm), the density (for example, $10^9$ to $10^{11}/cm^2$), and the like of the quantum dots 22 have to be changed in accordance with the range of the detection-target wavelength. Normally, the size of each quantum dot 22 is several nanometers. In Embodiment 1, the size is 3 nm.

While the composition of the barrier layer 23 is basically the same as the other barrier layers 21, the proportion of Al is gradually reduced towards the light emitting portion 3. In addition, the film thickness of the barrier layer 23 is larger than each of the barrier layers 21. This is because it is preferable for the barrier layer 23 to inject the electrons generated in the photo-current generating portion 2 into the well layer 31 of the light emitting portion 3 efficiently without causing the scattering of the electrons. When, for example, the barrier layer 23 has the same composition as that of each barrier layer 21, the entire potential difference caused by the electrical field applied to the barrier layer 23 becomes the barrier. For this reason, in order to make the barrier (potential difference) as low as possible, the Al composition of the barrier layer 23 is gradually reduced towards the light emitting portion 3. Accordingly, the growth of the barrier layer 23 is carried out by a method which is based on the growth method of the barrier layers 21 but in which the Al composition is gradually reduced by lowering, gradually, the Al cell temperature.

The film thickness of the barrier layer 23 is smaller than the electron mean free path (the distance that the electrons can travel without being scattered) so as to cause the least possible scattering of the electrons. Suppose a case, for example, where the bulk GaAs mobility (77 K, $1\times10^{16}$ $cm^{-3}$) $\mu$=20000 $cm^2/Vs$, the GaAs electron effective mass m*=0.067 $m_o$=0.067×9.1×$10^{-31}$, the collisional relaxation time $\tau=\mu m^*/e$=0.76 ps, the electron velocity (high electrical field) v=1.0× $10^7$ cm/s. In this case, the electron mean free path L=v×$\tau$=76 nm. Accordingly, the film thickness of the barrier layer 23 is 76 nm or smaller. In addition, since each barrier layer 21 has a thickness of 25 nm or larger, the barrier layer 23 is designed to have a thickness of 50 nm or larger.

Figure 3:
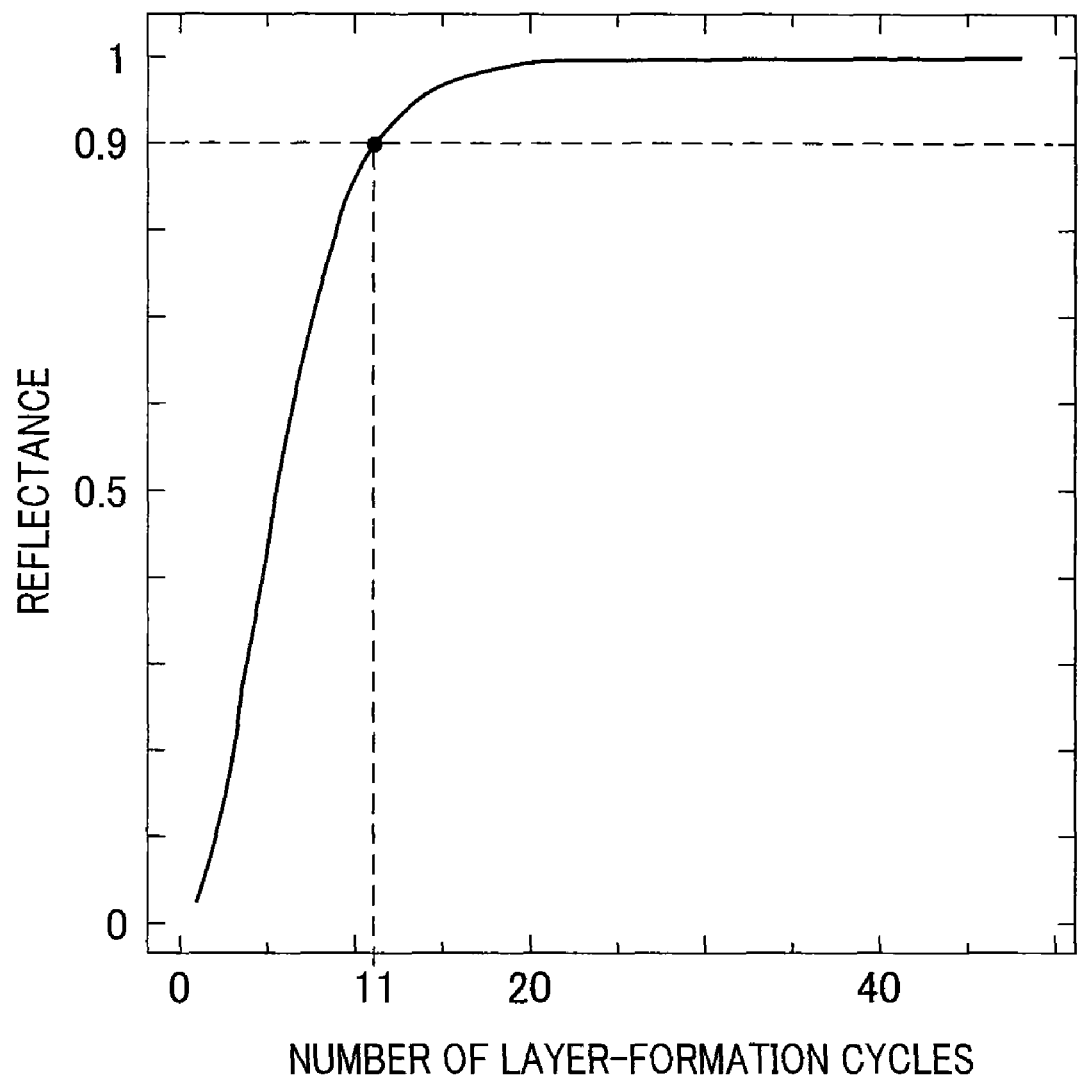
FIG. 3 is a graph illustrating the relationship between the number of layer-formation cycles and the reflectance.

At the last stage, also by the MBE method, the plural second reflection layers 12 made of GaAs and the plural first reflection layers 11 made of AlAs are alternately formed on top of the photo-current generating portion 2. Thus formed is the reflection portion 1 (see FIG. 2C). During these series of processes, the growth time is determined on the basis of each growth rate calculated beforehand so that each layer can have a designed film thickness. In accordance with the growth time thus determined, a control to open and close the cell shutters is carried out. Every time the growth of each of the second reflection layers 12 made of GaAs has been finished, a growth-interruption time of approximately 30 seconds is secured so as to obtain a flat interface. In contrast, the first reflection layers 11 made of AlAs are likely to take in impurities during the growth-interruption time. For this reason, no growth-interruption time is secured when the growth of each first reflection layer 11 is finished. In addition, the number of layers of the first reflection layers 11 and of the second reflection layers 12 is determined so that the formation of the pair of one first reflection layer 11 and one second reflection layer 12 may be repeated at least 11 times. This is because the reflectance of 90% or higher has to be secured for the rays in the near-infrared range and in the visible range. As FIG. 3 illustrates, such a reflectance can be secured with 11 cycles of forming the pair. Note that, in Embodiment 1, the wavelength of the rays emitted from the light emitting portion 3 is assumed to be 895 nm, the refractive index of each first reflective layer 11 $n_{(AlAs)}$=2.89, the refractive index of each second reflective layer 12 $n_{(GaAs)}$=3.41, the film thickness of each first reflective layer 11 $t_{(AlAs)}$=77.6 nm, and the film thickness of each second reflective layer 12 $t_{(GaAs)}$=65.8 nm.

When all the growth processes are over, the temperature of the GaAs substrate 10 is lowered down. Once the temperature becomes as low as 300° C., the As cell shutter is closed. When the temperature of the GaAs substrate 10 becomes as low as approximately the room temperature, the GaAs substrate 10 is taken out of the MBE chamber.

As has been described above, the use of a GaAs substrate in the method of manufacturing an infrared detector according to Embodiment 1 allows the infrared detector to have a large diameter. In addition, all the layers in the reflective portion 1, the photo-current generating portion 2, and the light emitting portion 3 are formed through only the crystal growth achieved through the processes of the technically-matured MBE method, so that the yield of the manufacturing of the infrared detectors becomes higher than the conventional method. Moreover, unlike the QWIP structure, it is not necessary to form an optical coupling structure for scattering incident infrared rays. Thus, the element structure is simplified, and the manufacturing process is also simplified. Note that the order of forming the layers can be reversed to deal with the case of the back-side incidence.

3. Image-Sensor Formation Step

When the infrared detector of Embodiment 1 is formed as an image sensor with a large number of pixels, such an image sensor can be formed, after the above-described growth step, by the following manufacturing method.

The surface of the infrared detector that has been through the growth step is spin coated with a resist. Then the resist is baked to be hardened. With a mask to reduce the size down to that of the device, the resist is exposed to UV rays. Then, the detector with the resist is developed with a developer. With a sulfuric-acid etchant, the detector is etched until the layer on which the lower electrode is to be deposited is exposed. After that, the metal that is designed to be the lower electrode is deposited. When, for example, the layer on which the lower electrode is to be deposited is an n-type layer, AuGe (12%)/Ni/Au is deposited. When, for example, the layer on which the lower electrode is to be deposited is a p-type layer, AuSb (5%)/Ni/Au is deposited. The upper electrode that is to be described later is deposited in the same way. The metal thus deposited is lifted off together with the resist except for the portion that is to be used as the lower electrode. The planar shape of the lower electrode is, for example, a comb shape, or a "#" shape.

At the last stage, the surface of the infrared detector is spin coated with a resist again, and the infrared detector with the resist is baked to harden the resist. With a mask for the upper electrode, the resist is exposed to UV rays. Then, the resist is developed with a developer. After that, the metal that is designed to be the upper electrode is deposited in an opening portion formed in the resist. The metal thus deposited is lifted off together with the resist except for the portion that is to be used as the upper electrode. The planar shape of the upper electrode is also, for example, a comb shape, or a "#" shape.

As has been described above, an image sensor with a large number of pixels can be formed readily according to the present invention.

[Embodiment 2]

Figure 4A:
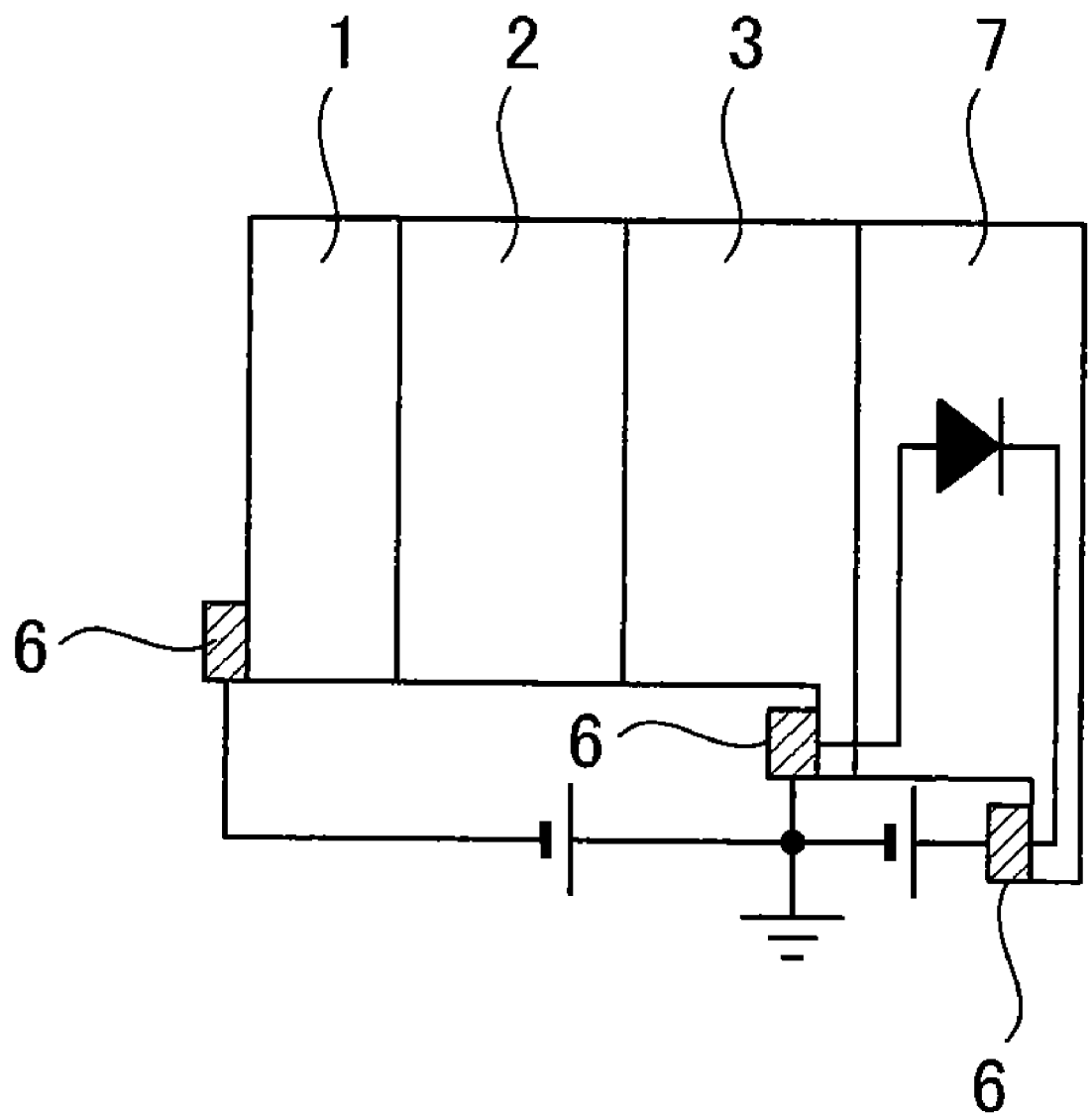
FIG. 4A is a diagram describing, schematically, the configuration of an infrared detector according to a second embodiment of the present invention.
Figure 4B:
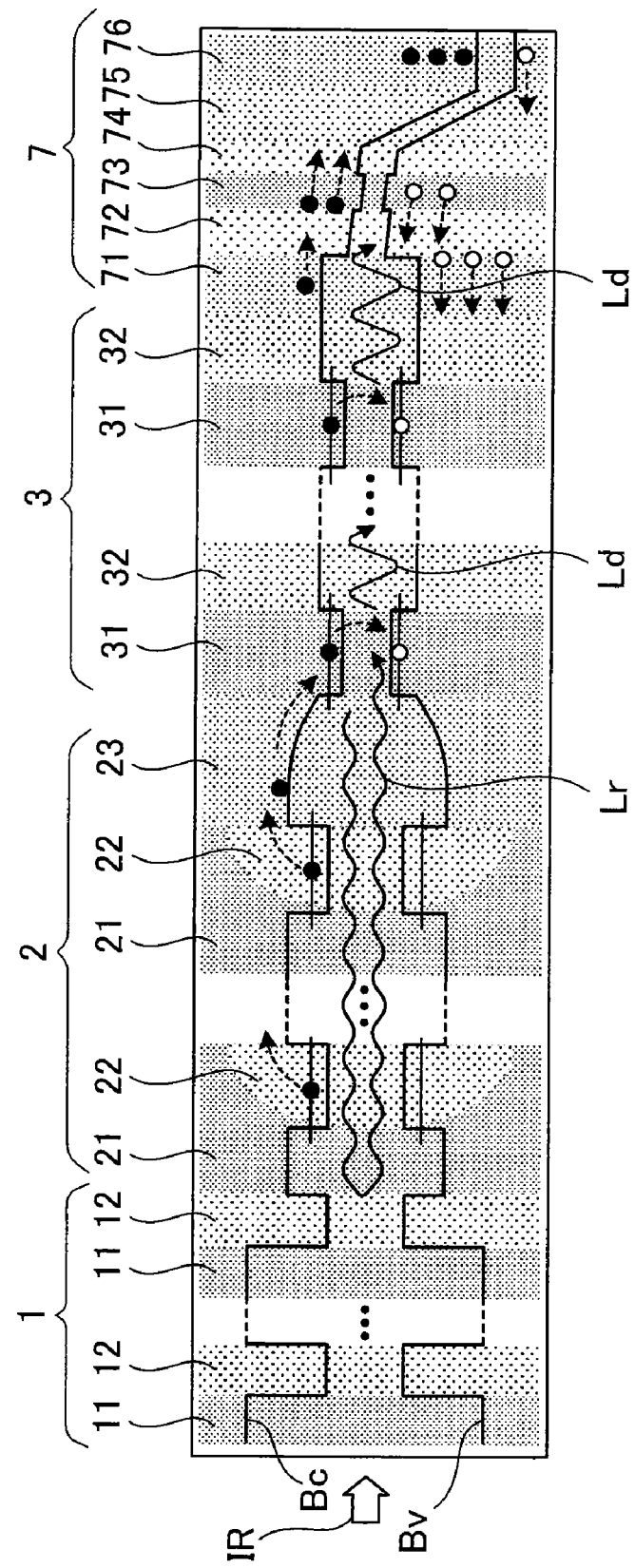
FIG. 4B is a diagram describing the infrared detector according to the second embodiment of the present invention, describing the structure of the infrared detector and its energy bands.
Figure 5A:
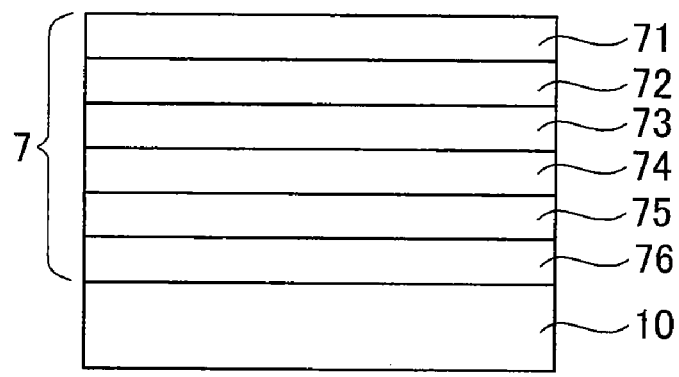
FIG. 5A is a diagram describing a method of manufacturing the infrared detector illustrated in FIG. 4B.
Figure 5B:
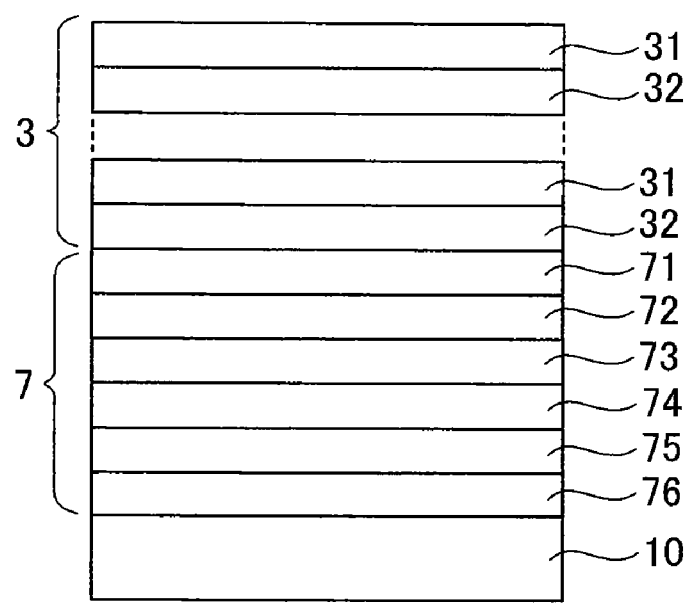
FIG. 5B is a diagram describing the method of manufacturing the infrared detector illustrated in FIG. 4B.
Figure 5D:
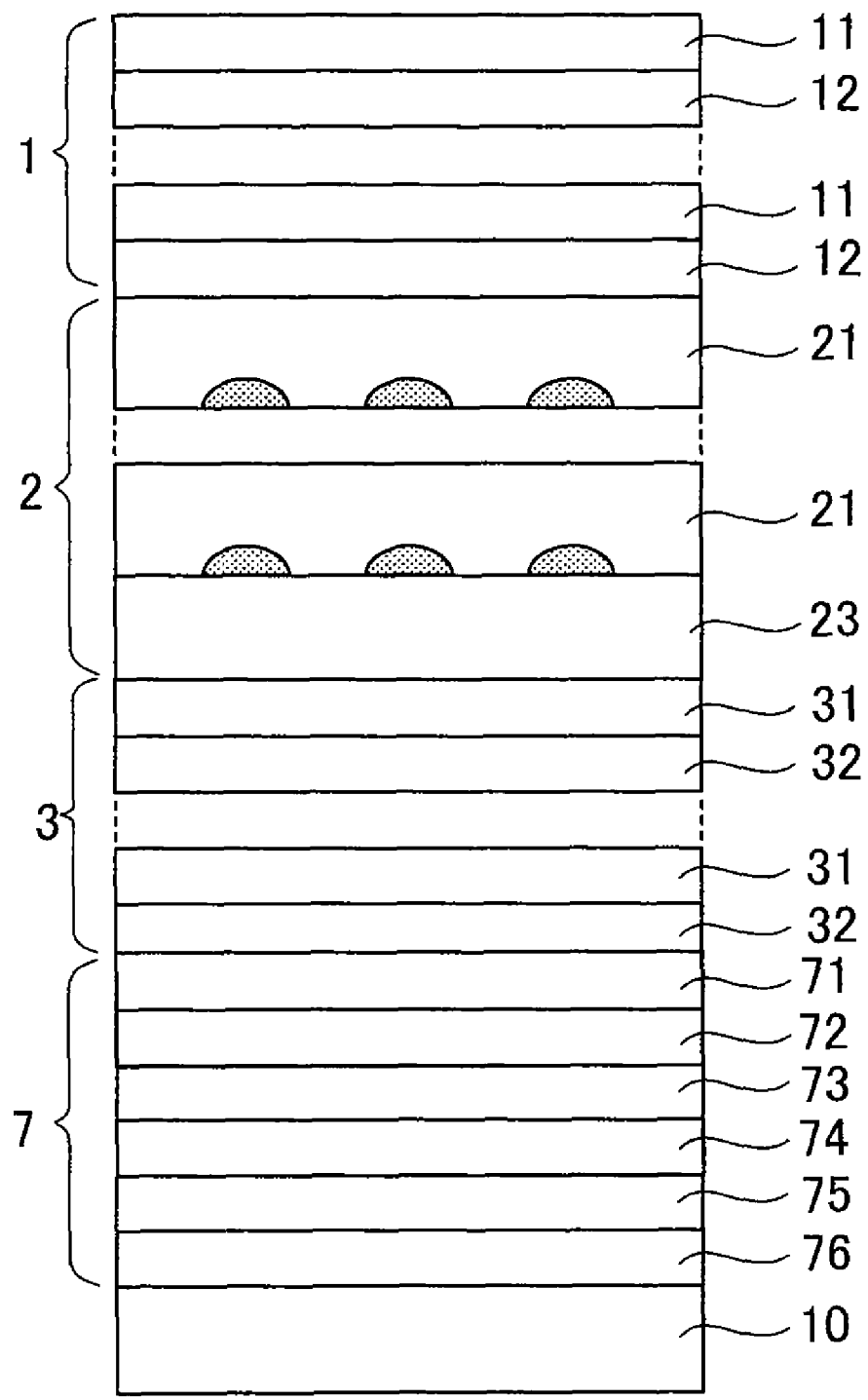
FIG. 5D is a diagram describing the method of manufacturing the infrared detector illustrated in FIG. 4B.

FIGS. 4A and 4B are diagrams describing an infrared detector according to a second embodiment of the present invention. FIG. 4A is a diagram describing, schematically, the configuration of the infrared detector. FIG. 4B is a diagram describing the structure of the infrared detector and its energy bands. FIGS. 5A to 5D are diagrams describing a method of manufacturing the infrared detector. Note that in the following description those constituent elements of the infrared detector of Embodiment 2 that have their respective counterparts in the infrared detector of Embodiment 1 are denoted by the same reference numerals.

As FIG. 4A illustrates, the infrared detector of Embodiment 2 includes a reflection portion 1, a photo-current generating portion 2, a light emitting portion 3, and a photo-detecting portion 7. The reflection portion 1 transmits rays in the far-infrared range and in the middle-infrared range, but reflects rays in the near-infrared range and in the visible range. The photo-current generating portion 2 has multiple quantum dot structures. In the multiple quantum dot structures, the rays in the far-infrared range and in the middle-infrared range that have passed through the reflection portion 1 excite electrons, and the electrons thus excited generate photo current. The light emitting portion 3 has multiple quantum well structures. The electrons of the photo current thus generated in the photo-current generating portion 2 are injected into the multiple quantum well structures, and are recombined with the holes. Consequently, rays in the near-infrared range and in the visible range are emitted from the light emitting portion 3. The photo-detecting portion 7 detects the rays in the near-infrared range and in the visible range thus emitted from the light emitting portion 3. Some of the rays in the near-infrared range and in the visible range that are emitted from the light emitting portion 3 are reflected by the reflection portion 1. These rays reflected by the reflection portion 1 are also detected by the photo-detecting portion 7. The reflection portion 1, the photo-current generating portion 2, the light emitting portion 3, and the photo-detecting portion 7 are layered so as to form a single united body of the infrared detector of Embodiment 2.

The light emitting portion 3 and the photo-detecting portion 7 share a single ground electrode 6 disposed therebetween. A positive electrode 6 and a negative electrode 6 are disposed respectively at the two end portions of the infrared detector. The infrared detector is driven by the application of a predetermined voltage to the entirety of the infrared detector. To electrically connect each of the electrodes 6 to the infrared detector, contact layers (not illustrated) are provided. Note that a barrier layer 32 and an APD upper-electrode layer 71, which are to be described later, are provided to serve as the contact layers for the electrodes 6 that are connected respectively to the light emitting portion 3 and to the photo-detecting portion 7 (see FIGS. 4A and 4B and 5A to 5D).

In the infrared detector of Embodiment 2, all of the reflecting portion 1, the photo-current generating portion 2, the light emitting portion 3, and the photo-detecting portion 7 are each made of a group III-V compound semiconductor (for example, a GaAs-based material). In the infrared detector, layers of the photo-detecting portion 7, the light emitting portion 3, the photo-current generating portion 2, and the reflecting portion 1 are formed, in this order, on top of a substrate made of a group III-V compound semiconductor (for example, a GaAs substrate) so as to form a single united body.

The infrared detector of Embodiment 1 is formed by bonding the first element and the second element with the bonding portion 5 located in between. For this reason, defects of the bonding portion 5 or the like may cause a loss of the rays in the near-infrared range and in the visible range emitted from the light emitting portion 3. The entire infrared detector of Embodiment 2, however, is formed, as a single united body, through only the crystal growth accomplished by the MBE method (the formation of the infrared detector will be described later). Accordingly, the infrared detector of Embodiment 2 has no bonding portion 5 in the first place. This is why the infrared detector of Embodiment 2 can achieve reduction in the loss of the rays in the near-infrared range and in the visible range emitted from the light emitting portion 3 and can have further improved detection sensitivity.

More specific element structure will be described with reference to FIG. 4B.

The reflecting portion 1 includes first reflection layers 11 and second reflection layers 12. The refractive index of each first reflection layer 11 is different from that of each second reflection layer 12. The reflecting portion 1 has a structure in which the plural first reflection layers 11 and the plural second reflection layers 12 are formed alternately and cyclically so that distributed Bragg reflection of the rays in the near-infrared range and in the visible range can be caused. As to the materials used for these layers, the first reflection layers 11 are made, for example, of AlAs while the second reflection layers 12 are made, for example, of GaAs.

The photo-current generating portion 2 includes barrier layers 21 and multiple quantum dots 22. The quantum dots 22 are designed to function as a quantum well. The multiple layers each formed with the quantum dots 22 which are embedded in the barrier layer 21 form the multiple structures of the photo-current generating portion 2. The photo-current generating portion 2 has a structure equivalent to what is known as a QDIP, and has a structure with the barrier layers 21 made, for example, of AlGaAs and the quantum dots 22 made, for example, of $In_xGa_{1-x}As$ ($0<x\leq 1$). There are things that have to be noted concerning one of the barrier layers 21 adjacent to the light emitting portion 3 (hereafter, that barrier layer 21 will be referred to as a barrier layer 23). While the composition of the barrier layer 23 is basically the same as the composition of the other barrier layers 21, the proportion of each constituent of the barrier layer 23 is gradually changing in the film-thickness direction of the barrier layer 23 for the reasons to be described later. Consequently, the band gap is gradually narrowed towards the light emitting portion 3. In addition, the film thickness of the barrier layer 23 is larger than that of each barrier layer 21, but thinner than the electron mean free path. Note that, to simplify the description, FIG. 4B also illustrates one quantum dot 22 in each layer of the multiple structures. However, as FIG. 5C and so forth illustrate, the multiple quantum dots 22 are actually formed in each layer, and a multiple number of such layers are formed with the barrier layers 21 each interposed between two of the layers.

The light emitting portion 3 includes a well layer 31 and a barrier layer 32. In the single quantum well structure of the light emitting portion 3, the well layer 31, which is designed to function as a quantum well, is sandwiched by the barrier layer 32 of the light emitting portion 3 and the adjacent barrier layer 23 of the photo-current generating portion 2 so as to form a band gap that is to emit rays in the near-infrared range and in the visible range. Moreover, multiple numbers of the well layers 31 and the barrier layers 32 are alternately stacked to form the multiple quantum well structures of the light emitting portion 3. As to the materials used for these layers, the well layer 31 is made, for example, of InGaAs while the barrier layer 32 is made, for example, of GaAs. Alternatively, the barrier layer 32 may be made of AlGaAs. In addition, the barrier layer 32 serves also as a contact layer that the electrode 6 is connected to.

The photo-detecting portion 7 includes the above-mentioned APD upper-electrode layer 71, a spacer layer 72, a light absorbing layer 73, a spacer layer 74, a multiplication layer 75, and an APD lower-electrode layer 76. These layers are sequentially formed one upon another to form the photo-detecting portion 7. To put it differently, in Embodiment 2, an APD serves as what is termed the second element in Embodiment 1. The photo-detecting portion 7 may be made, for example, of GaAs alone, but, in Embodiment 2, the APD upper-electrode layer 71 is made of AlGaAs, the light absorbing layer 73 is made of InGaAs, the spacer layers 72 and 74 are made of AlGaAs, the multiplication layer 75 is made of AlGaAs, and the APD lower-electrode layer 76 is made of AlGaAs. Note that the light absorbing layer 73 is made of InGaAs as in the case of the well layer 31 of the light emitting portion 3. Accordingly, the emitted rays are absorbed by the light absorbing layer 73 with an InGaAs composition that has an emitting wavelength close to that of the InGaAs composition of the light emitting portion 3. This can improve the absorption efficiency.

The infrared detector of Embodiment 2 is configured to have the following detection target wavelength. The rays in the far-infrared range and in the middle-infrared range that excite the electrons in the photo-current generating portion 2 have a wavelength ranging from 2 μm to 12 μm. The rays in the near-infrared range and in the visible range that are emitted from the light emitting portion 3 and detected by the photo-detecting portion 7 have a wavelength ranging from 860 nm to 1000 nm (at normal temperature).

Next, the operational principle of the infrared detector of Embodiment 2 will be described with reference to the energy bands that FIG. 4B illustrates. In FIG. 4B, Bc represents the conduction band, and By represents the valence band. Rays in the far-infrared range and in the middle-infrared range, which are denoted by IR, enter the infrared detector from the left-hand side of the drawing.

As FIG. 4B illustrates, quantum wells are formed in the photo-current generating portion 2 by providing the quantum dots 22 therein, and the electrons (represented by black circles in the drawing) exist in the quantum wells and at the energy level of the conduction-band side (Bc side). These electrons are excited by absorbing the incident rays in the far-infrared range and in the middle-infrared range. The electrons are eventually injected into the well layer 31 of the light emitting portion 3 via the barrier layer 23 (see, the arrowed dot-lines). Here, the electrons having been generated in the photo-current generating portion 2 can be efficiently injected into the well layer 31 of the light emitting portion 3 without scatter by setting appropriately the composition and the film thickness of the barrier layer 23 (detailed description for the settings will be given later).

As FIG. 4B illustrates, multiple quantum wells are formed in the light emitting portion 3, as well, by sandwiching the well layers 31 between the barrier layer 23 and the barrier layer 32 and between pairs of the adjacent barrier layers 32. In the well layer 31, holes (represented by the white circle in the drawing) exist at the energy level of the valence-band side (Bv side). The holes and the electrons injected into the well layer 31 are recombined in the well layer 31, so that rays in the near-infrared range and in the visible range, which have larger energy, can be emitted. In addition, the multiple quantum well structures allow the electrons injected from the photo-current generating portion 2 to be recombined with the holes in the well layers 31 efficiently, so that the above-described rays in the near-infrared range and in the visible range can be efficiently emitted.

The rays in the near-infrared range and in the visible range are emitted mainly in the stacking direction of the layers of the infrared detector of Embodiment 2 (the horizontal direction in the drawing). The rays in the near-infrared range and in the visible range emitted to the side of the photo-detecting portion 7 (such rays are represented by Ld in the drawing) enter directly the photo-detecting portion 7, and the intensity of the rays Ld is measured by the photo-detecting portion 7. On the other hand, the rays in the near-infrared range and in the visible range emitted to the side of the reflection portion 1 (such rays are represented by Lr in the drawing) are reflected with high efficiency by the distributed Bragg reflection that occurs in the reflection portion 1, and then enter the photo-detecting portion 7. The intensity of the rays thus entered the photo-detecting portion 7 is measured by the photo-detecting portion 7. As a consequence, the rays in the near-infrared range and in the visible range emitted from the light emitting portion 3 can be detected by the photo-detecting portion 7 with high efficiency.

The photo-detecting portion 7 is reversely biased, so that a high electrical field is formed in the depletion layer within the light absorbing layer 73. The rays that have entered the photo-detecting portion 7 are absorbed by the light absorbing layer 73 so that electron-hole pairs are formed. These carriers (i.e., the electrons and the holes) are accelerated by the high electrical field. The accelerated carriers with high energy collide with the lattice, so that secondary electron-hole pairs are formed. Such a process is repeated in the multiplication layer 75, so that the carriers are avalanche-multiplied. The carriers thus multiplied drift, so that the photo-current is generated. In summary, the rays in the far-infrared range and in the middle-infrared range incident into the infrared detector can be efficiently detected by detecting, with the photo-detecting portion 7, the rays in the near-infrared range and in the visible range emitted by the light emitting portion 3 and amplified by the photo-detecting portion 7.

Note that, the relationship among the photo-current generating portion 2, the light emitting portion 3, the photo-detecting portion 4 is also important for the efficient absorption of the incident rays in the far-infrared range and in the middle-infrared, the efficient emission of the rays in the near-infrared range and in the visible range, and the efficient detection of the emitted rays in the near-infrared range and in the visible range, respectively in the photo-current generating portion 2 with the QDIP structure, the light emitting portion 3 with the quantum well structures, and the photo-detecting portion 4 with the PD structure. Specifically, these portions are formed to satisfy [infrared-rays absorption energy in the photo-current generating portion 2<absorption energy in the photo-detecting portion 4<energy in the well layers 31 of the light emitting portion 3<fundamental absorption energy from valence band to the conduction band in the photo-current generating portion 2].

As has been described above, the infrared detector of Embodiment 2 has a wavelength-conversion function to convert the rays in the far-infrared range and in the middle-infrared range that have entered the infrared detector into the rays in the near-infrared range and in the visible range that have larger energy than the rays in the far-infrared range and in the middle-infrared range. The wavelength conversion is accomplished by making the light emitting portion 3 emit the rays in the near-infrared range and in the visible range. To this end, the electrons generated in the photo-current generating portion 2 by the incident rays in the far-infrared range and in the middle-infrared range are recombined with the holes in the light emitting portion 3. Besides the wavelength-conversion function, the infrared detector of Embodiment 2 has an optical confinement function to confine the rays that have been converted into the rays in the near-infrared range and in the visible range to the inside of the infrared detector. To this end, the reflection portion 1 reflects the rays in the near-infrared range and in the visible range that have been emitted by the light emitting portion 3. In addition, the infrared detector of Embodiment 2 has an avalanche-multiplication function to avalanche multiply the electrons generated by the incident rays in the near-infrared range and in the visible range emitted by the light emitting portion 3. To this end, the photo-detecting portion 7 has an APD structure. In summary, the infrared detector of Embodiment 2 is formed as a united body by combining together the photo-current generating portion 2 that has a QDIP structure, the light emitting portion 3 that has the wavelength-conversion function, the reflection portion 1 that has the optical confinement function, and the photo-detecting portion 7 that has the avalanche-multiplication function. The rays in the near-infrared range and in the visible range that have been subjected to the wavelength conversion are confined to the inside of the single infrared detector, then are amplified, and then detected by the same single infrared detector. For this reason, in comparison to the ordinary QDIP-type infrared detectors and to the infrared detector of Embodiment 1, the infrared detector of Embodiment 2 can accomplish an improvement in the detection efficiency (i.e., an improved S/N ratio).

Note that the photo-current generating portion 2 and the light emitting portion 3 described above in Embodiment 2 are also n-type devices that employ electrons as the carriers. Alternatively, the photo-current generating portion 2 and the light emitting portion 3 may be p-type devices that employ holes as the carriers. Although the operational principle of this case is the same as in the above-described case of Embodiment 2 with electrons as the carriers, there are differences between these cases in the barrier heights of the conductive band and of the valence band as well as in the effective mass. Accordingly, the photo-current generating portion 2 and the light emitting portion 3 of the case with holes as the carriers have to be configured appropriately by taking these differences into account.

Next, a method of manufacturing an infrared detector according to Embodiment 2 will be described with reference to FIGS. 5A to 5D.

1. Preparation Step

To begin with, a GaAs substrate 10 is subjected to an ultrasonic cleaning process using an organic alkali solvent, such as Semicoclean (trade name), and is then subjected to another ultrasonic cleaning process using ultrapure water. After the cleaning processes, the GaAs substrate 10 is brought into a pre-bake chamber, and is pre-baked (approximately at 200° C.) under an ultrahigh vacuum condition (approximately, at a pressure ranging from $1 \times 10^{-7}$ torr to $1 \times 10^{-10}$ torr) so as to remove the moisture.

In the meanwhile, Ga, Al, As, and In are heated to a high temperature in an MBE chamber, and the molecular beam pressure of each substance is measured. Then, the growth rates of GaAs, AlAs, AlGaAs, InGaAs, and InAs are measured by opening the molecular beam cell shutters when necessary. For example, when the growth rate of GaAs is measured, the As cell shutter and the Ga cell shutter are opened so as to allow GaAs to grow. The occurrence of the GaAs growth has to be checked. Note that the method used to form layers described later is not limited to the MBE method, and the MOCVD method, for example, may be used.

While the As pressure is set at around $1 \times 10^{-5}$ torr, the GaAs substrate 10 from which the moisture has been removed is brought into the MBE chamber. The GaAs substrate 10 is then heated up to 580° C. In this event, while the temperature is 300° C. or higher, the As cell shutter is opened to avoid the separation of As.

2. Growth Step

The APD lower-electrode layer 76 made of AlGaAs, the multiplication layer 75 made of AlGaAs, the spacer layer 74 made of AlGaAs, the light absorbing layer 73 made of InGaAs, the spacer layer 72 made of AlGaAs, and the APD upper-electrode layer 71 made of AlGaAs are sequentially formed on top of the GaAs substrate 10 by the MBE method. Thus foamed is the photo-detecting portion 7 (see FIG. 5A). During these series of processes, the growth time is determined on the basis of each growth rate calculated beforehand so that each layer can have a designed film thickness. In accordance with the growth time thus determined, a control to open and close the cell shutters is carried out. Every time the growth of each of the APD lower-electrode layer 76, the multiplication layer 75, the spacer layers 72 and 74, and the APD upper-electrode layer 71, all of which are made of AlGaAs, has been finished, a growth-interruption time of approximately 30 seconds is secured so as to obtain a flat interface.

The APD upper-electrode layer 71 together with the barrier layer 32 function as contact layers that the common electrode is deposited onto. The common electrode is deposited onto the APD upper-electrode layer 71 and onto the barrier layer 32 at a step to be described later under the section header "3. Image-Sensor Formation Step." Accordingly, the APD upper-electrode layer 71 and the barrier layer 32 may have completely the same composition. For example, when the APD upper-electrode layer 71 is made of p-type $Al_{0.1}Ga_{0.9}As$, the barrier layer 32 may be made of the same p-type $Al_{0.1}Ga_{0.9}As$. In this case, the APD upper-electrode layer 71 and the barrier layer 32 are formed continuously by the MBE method so as to form a thick layer (for example, with a thickness of 1 μm, approximately). Needless to say, the composition of the APD upper-electrode layer 71 may be determined in accordance with the composition of the barrier layer 32. For example, when the barrier layer 32 is made of p-type GaAs as in the case to be described later, the APD upper-electrode layer 71 may be made of the same p-type GaAs.

The plural barrier layers 32 made of GaAs and the plural well layers 31 made of InGaAs are alternately formed on top of the photo-detecting portion 7 by the same method. Thus formed is the light emitting portion 3 (see FIG. 5B). During these series of processes, the growth time is determined on the basis of each growth rate calculated beforehand so that each layer can have a designed film thickness. In accordance with the growth time thus determined, a control to open and close the cell shutters is carried out. Once the growth of each of the barrier layers 32 made of GaAs has been finished, a growth-interruption time of approximately 30 seconds is secured so as to obtain a flat interface. The well layer 31 has to be lower than the band gap of the barrier layer 32, so that the In composition is increased as much as possible. However, there are some things that have to be noted as to the increasing of the In composition. As the In composition increases, the layer (flat plane) becomes thinner and thinner. For example, with the In composition of 0.2, the well layer 31 has a thickness of 4.2 nm or smaller. With the well layer 31 of 4.2-nm or larger thickness, a quantum dot is produced. With the In composition of 0.3, the well layer 31 has a thickness of 1.7 nm or smaller. When the well layer 31 is too thin, the light-emitting efficiency is impaired. For this reason, the well layer 31 preferably has a 1-nm thickness, at least. Accordingly, in accordance with the In composition, the film thickness of the well layer 31 is set at an appropriate range.

Subsequently, the barrier layer 23 made of AlGaAs is formed on top of the light emitting portion 3 by the MBE method as in the case of the formation of the barrier layers 32 and the well layers 31. Then, the multiple quantum dots 22 made of $In_xGa_{1-x}As$ (0<x≦1) are formed. Thereafter, the barrier layer 21 made of AlGaAs is formed so that the multiple quantum dots 22 previously formed are embedded in the barrier layer 21. A multiple number of such layers each formed with the quantum dots 22 embedded in the barrier layer 21 are formed. Thus formed is the photo-current generating portion 2 (see FIG. 5C). During these series of processes, the growth time is determined on the basis of each growth rate calculated beforehand so that each layer can have a designed film thickness and a designed size. In accordance with the growth time thus determined, a control to open and close the cell shutters is carried out. Every time the growth of each of the barrier layers 21 and 23 made of AlGaAs has been finished, a growth-interruption time of approximately 30 seconds is secured so as to obtain a flat interface. In addition, the number of layers of the barrier layers 21 with the quantum dots 22 is determined normally so that the formation of one barrier layer 21 with the quantum dots 22 may be repeated 10 to 100 times.

The quantum dots 22 made of $In_xGa_{1-x}As$ (0<x≦1) are formed, using the MBE method, for example, at a growth temperature of approximately 500° C., by the self-assembled phenomenon in the S-K (Stranski-Krastanov) mode utilizing lattice mismatch. In this self-assembled phenomenon, first, at the initial stage of the growth, a flat $In_xGa_{1-x}As$ (0<x≦1) wetting layer is grown two-dimensionally following the crystal structure of AlGaAs of the barrier layer 21 or 23 that serves as the underlayer material. Then, to relieve the strain energy due to the difference in lattice constant from the underlayer material, the $In_xGa_{1-x}As$ (0<x≦1) wetting layer with such a flat structure is rearranged, so that the $In_xGa_{1-x}As$ (0<x≦1) layer is grown three-dimensionally into the form of islands. Thus, the multiple quantum dots 22 are formed.

Each of the barrier layers 21 has a 25-nm thickness, at least. Such a thickness is large enough to prevent the electrons confined in the quantum dots 22 from reacting with the electrons in the other quantum dots 22 which are located adjacent in the stacking direction. Normally, the thickness of each barrier layer 21 is set at 25 nm to 50 nm. On the other hand, the material and composition (for example, InAs, InGaAs, InAlAs, InGaAlAs, GaInNAs, GaSb, AlGaSb, InGaSb, GaAsSb), the size (for example, 3 nm to 40 nm), the density (for example, $10^9$ to $10^{11}/cm^2$), and the like of the quantum dots 22 have to be changed in accordance with the range of the detection-target wavelength. Normally, the size of each quantum dot 22 is several nanometers. In Embodiment 2, the size is 3 nm.

While the composition of the barrier layer 23 is basically the same as the other barrier layers 21, the proportion of Al is gradually reduced towards the light emitting portion 3. In addition, the film thickness of the barrier layer 23 is larger than each of the barrier layers 21. This is because it is preferable for the barrier layer 23 to inject the electrons generated in the photo-current generating portion 2 into the well layer 31 of the light emitting portion 3 efficiently without causing the scattering of the electrons. When, for example, the barrier layer 23 has the same composition as that of each barrier layer 21, the entire potential difference caused by the electrical field applied to the barrier layer 23 becomes the barrier. For this reason, in order to make the barrier (potential difference) as low as possible, the Al composition of the barrier layer 23 is gradually reduced towards the light emitting portion 3. Accordingly, the growth of the barrier layer 23 is carried out by a method which is based on the growth method of the barrier layers 21 but in which the Al composition is gradually reduced by lowering, gradually, the Al cell temperature.

The film thickness of the barrier layer 23 is smaller than the electron mean free path (the distance that the electrons can travel without being scattered) so as to cause the least possible scattering of the electrons. Suppose a case, for example, where the bulk GaAs mobility (77 K, $1\times10^{16}$ $cm^{-3}$) μ=20000 $cm^2/Vs$, the GaAs electron effective mass m*=0.067 $m_o$=0.067×9.1×$10^{-31}$, the collisional relaxation time τ=μm*/e=0.76 ps, the electron velocity (high electrical field) v=1.0× $10^7$ cm/s. In this case, the electron mean free path L=v×τ=76 nm. Accordingly, the film thickness of the barrier layer 23 is 76 nm or smaller. In addition, since each barrier layer 21 has a thickness of 25 nm or larger, the barrier layer 23 is designed to have a thickness of 50 nm or larger.

At the last stage, also by the MBE method, the plural second reflection layers 12 made of GaAs and the plural first reflection layers 11 made of AlAs are alternately formed on top of the photo-current generating portion 2. Thus formed is the reflection portion 1 (see FIG. 5D). During these series of processes, the growth time is determined on the basis of each growth rate calculated beforehand so that each layer can have a designed film thickness. In accordance with the growth time thus determined, a control to open and close the cell shutters is carried out. Every time the growth of each of the second reflection layers 12 made of GaAs has been finished, a growth-interruption time of approximately 30 seconds is secured so as to obtain a flat interface. In contrast, the first reflection layers made of AlAs are likely to take in impurities during the growth-interruption time. For this reason, no growth-interruption time is secured when the growth of each first reflection layer 11 is finished. In addition, the number of layers of the first reflection layers 11 and of the second reflection layers 12 is determined so that the formation of the pair of one first reflection layer 11 and one second reflection layer 12 may be repeated at least 11 times. This is because the reflectance of 90% or higher has to be secured for the rays in the near-infrared range and in the visible range. As FIG. 3 illustrates, such a reflectance can be secured with 11 cycles of forming the pair. Note that, also in Embodiment 2, the wavelength of the rays emitted from the light emitting portion 3 is assumed to be 895 nm, the refractive index of each first reflective layer 11 $n_{(AlAs)}$=2.89, the refractive index of each second reflective layer 12 $n_{(GaAs)}$=3.41, the film thickness of each first reflective layer 11 $t_{(AlAs)}$=77.6 nm, and the film thickness of each second reflective layer 12 $t_{(GaAs)}$=65.8 nm.

When all the growth processes are over, the temperature of the GaAs substrate 10 is lowered down. Once the temperature becomes as low as 300° C., the As cell shutter is closed. When the temperature of the GaAs substrate 10 becomes as low as approximately the room temperature, the GaAs substrate 10 is taken out of the MBE chamber.

As has been described above, the use of a GaAs substrate in the method of manufacturing an infrared detector according to Embodiment 2 allows the infrared detector to have a large diameter. In addition, all the layers in the reflective portion 1, the photo-current generating portion 2, the light emitting portion 3, and the photo-detecting portion 7 are formed through only the crystal growth achieved through the processes of the technically-matured MBE method, so that the yield of the manufacturing of the infrared detectors becomes higher than the conventional method. Moreover, unlike the QWIP structure, it is not necessary to form an optical coupling structure for scattering incident infrared rays. Thus, the element structure is simplified, and the manufacturing process is also simplified. Note that the order of forming the layers can be reversed to deal with the case of the back-side incidence.

3. Image-Sensor Formation Step

When the infrared detector of Embodiment 2 is formed as an image sensor with a large number of pixels, such an image sensor can be formed, after the above-described growth step, by the following manufacturing method.

The surface of the infrared detector that has been through the growth step is spin coated with a resist. Then the resist is baked to be hardened. With a mask to reduce the size down to that of the device, the resist is exposed to UV rays. Then, the detector with the resist is developed with a developer. With a sulfuric-acid etchant, the detector is etched until the n-type APD lower-electrode layer 76 onto which the lower electrode for the APD is to be deposited is exposed. After that, the metal [AuGe(12%)/Ni/Au] that is designed to be the lower electrode for the APD is deposited onto the n-type APD lower-electrode layer 76. The metal thus deposited is lifted off together with the resist except for the portion that is to be used as the lower electrode for the APD. The planar shape of the lower electrode for the APD is, for example, a comb shape, or a "#" shape.

Subsequently, the surface of the infrared detector is spin coated with a resist again. Then the resist is baked to be hardened. With a mask for the common electrode that is to serve both as the upper electrode for the APD and as the lower electrode for the QDIP, the resist is exposed to UV rays. Then, the detector with the resist is developed with a developer. With a sulfuric-acid etchant, the detector is etched until the barrier layer 32 onto which the common electrode is to be deposited is exposed. After that, the metal [AuSb(5%)/Ni/Au] that is designed to be the common electrode is deposited onto the p-type barrier layer 32. The metal thus deposited is lifted off together with the resist except for the portion that is to be used as the common electrode, that is, the ground electrode 6. The planar shape of the common electrode is also, for example, a comb shape, or a "#" shape.

At the last stage, the surface of the infrared detector is spin coated with a resist again, and the infrared detector with the resist is baked to harden the resist. With a mask for the upper electrode, the resist is exposed to UV rays. Then, the resist is developed with a developer. After that, the metal that is designed to be the upper electrode is deposited in an opening portion formed in the resist. The metal thus deposited is lifted off together with the resist except for the portion that is to be used as the upper electrode. The planar shape of the upper electrode is also, for example, a comb shape, or a "#" shape.

As has been described above, an image sensor with a large number of pixels can be formed readily according to the present invention.

[Embodiment 3]

Figure 6:
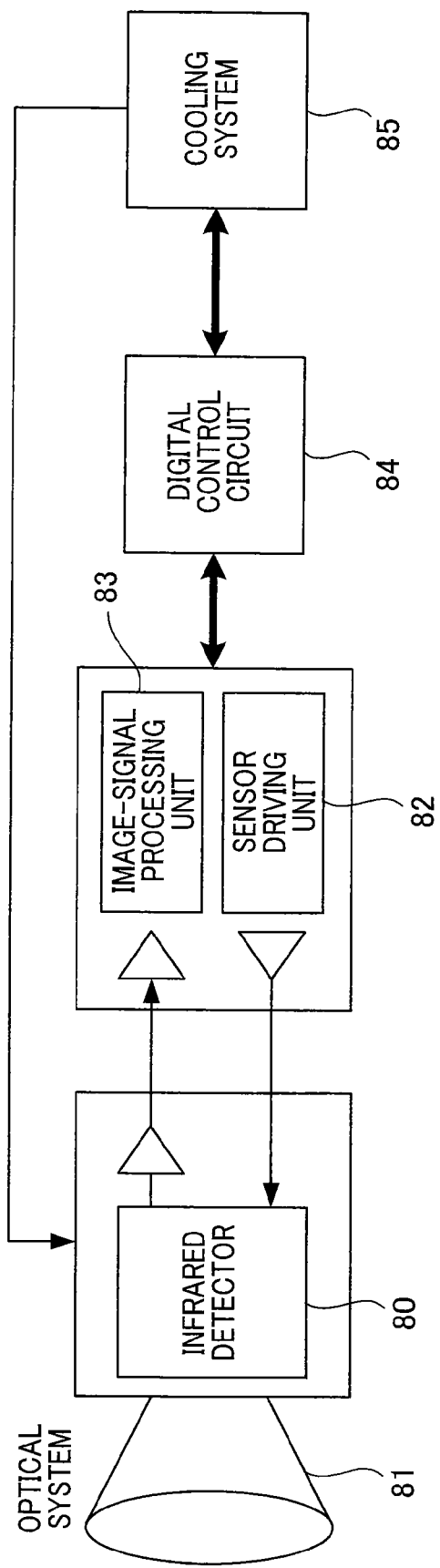
FIG. 6 is a block diagram illustrating an infrared detecting apparatus according to a third embodiment of the present invention.
Figure 7:
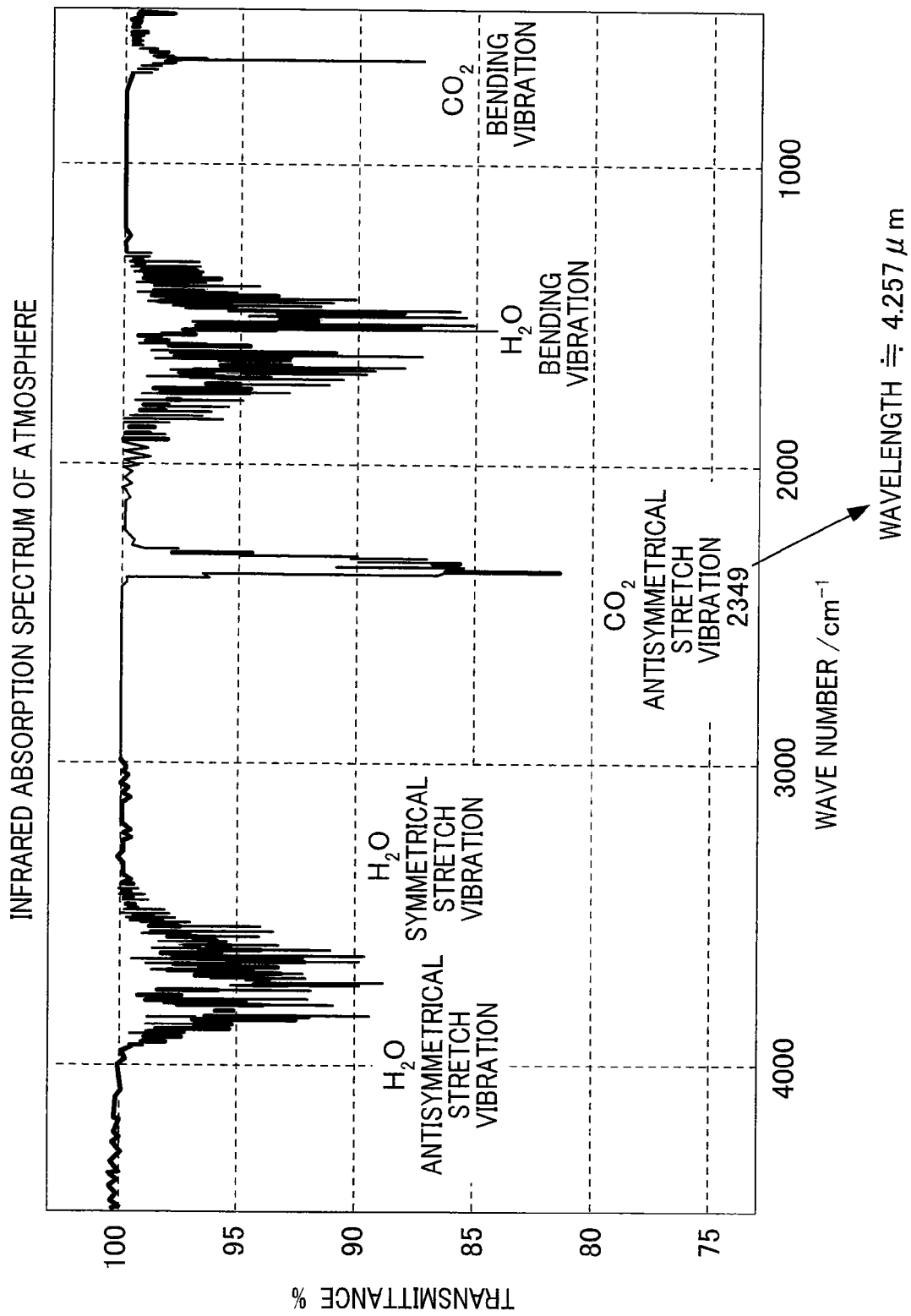
FIG. 7 is the infrared absorption spectrum of the atmosphere.

FIG. 6 is a block diagram illustrating an infrared detecting apparatus according to a third embodiment of the present invention.

The infrared detecting apparatus of Embodiment 3 includes an infrared detector 80, an optical system 81, a sensor driving unit 82, an image-signal processing unit 83, a digital control circuit 84, and a cooling system 85. The optical system 81 is disposed on the incident-surface side of the infrared detector 80. The sensor driving unit 82 drives and controls the infrared detector 80. The image-signal processing unit 83 executes the processing of the image signals detected by the infrared detector 80. The digital control circuit 84 controls the sensor driving unit 82 and the image-signal processing unit 83. The cooling system 85 is controlled by the digital control circuit 84, and cools down the infrared detector 80.

Any one of the infrared detectors described in Embodiments 1 and 2 can be employed as the infrared detector 80 of Embodiment 3. Accordingly, as in the cases of Embodiments 1 and 2, the infrared detecting apparatus of Embodiment 3 can achieve improved detection efficiency (i.e., S/N ratio) in comparison to conventional infrared detecting apparatuses.

The infrared detecting apparatus with the above-described configuration can be mounted, for example, on a satellite to observe rays in a certain predetermined wavelength range from the surface of the globe. Such a use of the infrared detecting apparatus makes it possible to observe the state of the atmosphere of the globe and the state of the surface of the globe. In addition, when astronomical observation to observe the state of the celestial objects is carried out, the above-mentioned use of the infrared detecting apparatus can eliminate the influence of the infrared rays, which is not negligible in the case of the observation from the ground.

In addition, the infrared detecting apparatus can be adapted to observe a certain predetermined wavelength range by an appropriate configuration of the photo-current generating portion 2. Specifically, one of the things desired in view of the problem of global warming is highly efficient and highly accurate observation of carbon dioxide ($CO_2$) concentration in the atmosphere. The infrared detecting apparatus can be adapted to detect $CO_2$ concentration in atmosphere with high efficiency and high accuracy by precluding the influence of the infrared absorbing characteristics of other kinds of molecules. To this end, the quantum well structures of the photo-current generating portion 2 are configured appropriately so as to have infrared-detection sensitivity to a wavelength range including the absorption wavelength of $CO_2$ (4.257 μm, see FIG. 7). For example, the quantum well structures may be configured to have infrared-detection sensitivity to the wavelength range from 4 μm to 4.5 μm, inclusive.

For example, to attain a configuration that is suitable for the absorption wavelength of $CO_2$ (4.257 μm), each of the quantum dots 22 in the photo-current generating portion 2 has a size of 3 nm film thickness and is made of InGaAs while each of the barrier layers 21 has a film thickness of 30 nm or larger and is made of GaAs.

When the infrared detection apparatus for $CO_2$ with the above-mentioned configuration is mounted on a satellite, $CO_2$ concentration in atmosphere all over the globe can be observed with high efficiency and high accuracy. The use of any one of the infrared detectors of Embodiments 1 and 2 allows the infrared detecting apparatus to have improved detection efficiency (i.e., S/N ratio) in comparison to conventional $CO_2$ detecting apparatus. In addition, the use of any one of the infrared detectors of Embodiments 1 and 2 allows the infrared detecting apparatus to preclude the influence of the other molecules.

The present invention is suitable for infrared sensors and infrared image sensors used for the remote sensing on the globe and for the astronomical observation.

REFERENCE SIGNS LIST

1 Reflection Portion
2 Photo-Current Generating Portion
3 Light Emitting Portion
4, 7 Photo-Detecting Portion

The invention claimed is:

1. An infrared detector comprising:
a reflection portion which transmits rays in the far-infrared range and in the middle-infrared range and which reflects rays in the near-infrared range and in the visible range;
a photo-current generating portion having a plurality of layered quantum dot structures in each of which electrons are excited by the rays in the far-infrared range and in the middle-infrared range having passed through the reflection portion and in each of which the electrons thus excited generate photo-current;
a light emitting portion having a plurality of layered quantum well structures into each of which electrons of the photo-current generated by the photo-current generating portion are injected and in each of which the electrons thus injected thereinto are recombined with holes so as to emit rays in the near-infrared range and in the visible range; and
a photo-detecting portion which detects the rays in the near-infrared range and in the visible range emitted from the light emitting portion and which detects the rays in the near-infrared range and in the visible range emitted from the light emitting portion and then reflected by the reflection portion, the infrared detector, wherein
at least the reflection portion, the photo-current generating portion, and the light emitting portion are made of group III-V compound semiconductors, and are layered on top of a substrate, and
incident rays in the far-infrared range and in the middle-infrared range are detected by the detection, performed by the photo-detecting portion, of the rays in the near-infrared range and in the visible range emitted from the light emitting portion.

2. The infrared detector according to claim 1, wherein
the reflection portion, the photo-current generating portion, and the light emitting portion together form a first element,
the photo-detecting portion forms an independent second element, and
the first element and the second element are bonded to form a single united body.

3. The infrared detector according to claim 1, wherein
all of the reflection portion, the photo-current generating portion, the light emitting portion, and the photo-detecting portion are made of group III-V compound semiconductors, and are layered on the substrate made of a group III-V compound semiconductor so as to form a single united body.

4. The infrared detector according to any one of claims 1 to 3, wherein the photo-detecting portion is made of an avalanche photo diode.

5. The infrared detector according to any one of claims 1 to 3, wherein the reflection portion has a structure in which two different kinds of layers are alternately formed so as to cause distributed Bragg reflection of the rays in the near-infrared range and in the visible range, each of the layers of one kind having a refractive index that is different from a refractive index of each of the layers of the other kind.

6. The infrared detector according to any one of claims 1 to 3, wherein each of the quantum dot structures of the photo-current generating portion is configured so that the electrons are excited by infrared rays in a wavelength range from 4 μm to 4.5 μm, which includes the 4.257-μm absorption wavelength of carbon dioxide.

7. An infrared detecting apparatus comprising the infrared detector according to any one of claims 1 to 3.

8. The infrared detector according to any one of claims 1 to 3, wherein
in the quantum dot structure of the photo-current generating portion, a plurality of quantum dots that are designed to be a quantum well are embedded in a barrier layer,
a film thickness of a barrier layer which is included in the photo-current generating portion and which is adjacent to the light emitting portion is larger than a film thickness of the other barrier layer of the photo-current generating portion and is smaller than an electron mean free path, and
a composition ratio of the barrier layer which is included in the photo-current generating portion and which is adjacent to the light emitting portion is gradually changed in the film-thickness direction so that a band gap is gradually narrowed down towards the light emitting portion.

9. The infrared detector according to claim 8, wherein in at least one of the quantum well structures of the light emitting portion, a well layer which is included in the light emitting portion and which is designed to be a quantum well is sandwiched by a barrier layer of the light emitting portion and the barrier layer which is included in the photo-current generating portion and which is adjacent to the light emitting portion so as to form a band gap that is to emit rays in the near-infrared range and in the visible range.

10. A method of manufacturing an infrared detector comprising the steps of:
forming a light emitting portion on top of a substrate, the light emitting portion having a plurality of layered quantum well structures in each of which electrons and holes are recombined together so that rays in the near-infrared range and in the visible range are emitted;
forming a photo-current generating portion on top of the light emitting portion, the photo-current generating portion having a plurality of layered quantum dot structures in each of which electrons are excited by rays in the far-infrared range and in the middle-infrared range and in which the electrons thus excited generate photo-current that is to be injected into the light emitting portion;

forming a layer of a reflection portion on top of the photo-current generating portion so as to form a first element, the reflection portion transmitting rays in the far-infrared range and in the middle-infrared range incident into the photo-current generating portion, and reflecting rays in the near-infrared range and in the visible range emitted from the light emitting portion;

forming an independent second element with a photo-detecting portion which detects the rays in the near-infrared range and in the visible range emitted from the light emitting portion and which detects the rays in the near-infrared range and in the visible range emitted from the light emitting portion and reflected by the reflection portion; and bonding the first element and the second element to form a single united body, wherein at least the reflection portion, the photo-current generating portion, and the light emitting portion are made of group III-V compound semiconductors by the same crystal-growth method, and thereby an infrared detector that detects the incident rays in the far-infrared range and in the middle-infrared range by making the photo-detecting portion detect the rays in the near-infrared range and in the visible range emitted from the light emitting portion is manufactured.

11. A method of manufacturing an infrared detector comprising the steps of:

forming a layer of a photo-detecting portion on top of a substrate (10) made of a group III-V compound semiconductor, the photo-detecting portion detecting rays in the near-infrared range and in the visible range;

forming a light emitting portion on top of the photo-detecting portion, the light emitting portion having a plurality of layered quantum well structures in each of which electrons and holes are recombined together so that rays in the near-infrared range and in the visible range to be detected by the photo-detecting portion are emitted;

forming a photo-current generating portion on top of the light emitting portion, the photo-current generating portion having a plurality of layered quantum dot structures in each of which electrons are excited by rays in the far-infrared range and in the middle-infrared range and in which the electrons thus excited generate photo-current that is to be injected into the light emitting portion; and forming a layer of a reflection portion on top of the photo-current generating portion, the reflection portion transmitting rays in the far-infrared range and in the middle-infrared range incident into the photo-current generating portion, and reflecting rays in the near-infrared range and in the visible range, which are emitted from the light emitting portion, towards the photo-detecting portion, wherein all of the reflection portion, the photo-current generating portion, the light emitting portion, and the photo-detecting portion are made of group III-V compound semiconductors by the same crystal-growth method so as to form a single united body, and thereby an infrared detector that detects the incident rays in the far-infrared range and in the middle-infrared range by making the photo-detecting portion detect the rays in the near-infrared range and in the visible range emitted from the light emitting portion is manufactured.

12. The method of manufacturing an infrared detector according to any one of claims 10 and 11, wherein an avalanche photo diode is formed as the photo-detecting portion.

13. The method of manufacturing an infrared detector according to claims 10 or 11, wherein as the reflection portion, a structure is formed by alternately forming two different kinds of layers so as to cause distributed Bragg reflection of the rays in the near-infrared range and in the visible range, each of the layers of one kind having a refractive index that is different from a refractive index of each of the layers of the other kind.

14. The method of manufacturing an infrared detector according to claims 10 or 11, wherein each of the quantum dot structures of the photo-current generating portion is configured so that the electrons are excited by infrared rays in a wavelength range from 4 µm to 4.5 µm, which includes the 4.257-µm absorption wavelength of carbon dioxide.

15. The method of manufacturing an infrared detector according to any one of claims 10 and 11, wherein as the quantum dot structure of the photo-current generating portion, a structure is formed by embedding a plurality of quantum dots that are designed to be a quantum well in a barrier layer, a film thickness of a barrier layer which is included in the photo-current generating portion and which is adjacent to the light emitting portion is larger than a film thickness of the other barrier layer of the photo-current generating portion and is smaller than an electron mean free path, and a composition ratio of the barrier layer which is included in the photo-current generating portion and which is adjacent to the light emitting portion is gradually changed in the film-thickness direction so that a band gap is gradually narrowed down towards the light emitting portion.

16. The method of manufacturing an infrared detector according to claim 15, wherein as at least one of the quantum well structures of the light emitting portion, a structure is formed by sandwiching a well layer which is included in the light emitting portion and which is designed to be a quantum well between a barrier layer of the light emitting portion and the barrier layer which is included in the photo-current generating portion and which is adjacent to the light emitting portion so as to form a band gap that is to emit rays in the near-infrared range and in the visible range.

* * * * *